United States Patent
Lu et al.

(10) Patent No.: US 10,032,924 B2
(45) Date of Patent: Jul. 24, 2018

(54) METAL OXIDE THIN FILM TRANSISTOR WITH CHANNEL, SOURCE AND DRAIN REGIONS RESPECTIVELY CAPPED WITH COVERS OF DIFFERENT GAS PERMEABILITY

(71) Applicant: The Hong Kong University of Science and Technology, Hong Kong (CN)

(72) Inventors: Lei Lu, Kowloon (HK); Man Wong, New Territories (HK); Hoi Sing Kwok, New Territories (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 0 days.

(21) Appl. No.: 14/671,055

(22) Filed: Mar. 27, 2015

(65) Prior Publication Data
US 2015/0280002 A1    Oct. 1, 2015

Related U.S. Application Data

(60) Provisional application No. 61/967,970, filed on Mar. 31, 2014.

(51) Int. Cl.
*H01L 29/786* (2006.01)
*H01L 21/477* (2006.01)
(Continued)

(52) U.S. Cl.
CPC ........ *H01L 29/7869* (2013.01); *H01L 21/465* (2013.01); *H01L 21/477* (2013.01);
(Continued)

(58) Field of Classification Search
CPC .................................. H01L 29/7869
See application file for complete search history.

(56) References Cited

U.S. PATENT DOCUMENTS 5,414,283 A * 5/1995 den Boer .............. G02F 1/1368
257/59
5,757,028 A * 5/1998 Sasaki ............... H01L 29/78609
257/347

(Continued)

FOREIGN PATENT DOCUMENTS

CN    102646718 A    8/2012
CN    103311128 A    9/2013
(Continued)

OTHER PUBLICATIONS

H.-C. Wu, et al., "High performance InGaZnO thin film transistor with InGaZnO source and drain electrodes," Appl. Phys. Lett., vol. 102, p. 062103, 2013.

(Continued)

*Primary Examiner* — Eugene Lee
(74) *Attorney, Agent, or Firm* — Amin, Turocy & Watson, LLP

(57) ABSTRACT

An apparatus is provided that includes a substrate and source and drain regions within an annealed active layer having resulted from an annealing of an active layer comprising metal-oxide and formed on the substrate, and an impermeable layer over the source and drain regions of the annealed active layer, wherein the annealing resulting in the annealed active layer was performed with the impermeable layer over portions of the active layer corresponding to the source and drain regions, thereby resulting in a reduction of a resistivity of the source and drain regions of the annealed active layer relative to the active layer. In another aspect, a junctionless transistor is provided wherein the entire active area has a low resistivity based on annealing of an active layer including metal oxide while uncovered or at least partially covered with layers of various gas permeability under oxidizing or non-oxidizing conditions.

51 Claims, 22 Drawing Sheets

(51) Int. Cl.
*H01L 21/465* (2006.01)
*H01L 29/49* (2006.01)
*H01L 29/66* (2006.01)
*H01L 21/02* (2006.01)

(52) U.S. Cl.
CPC .... *H01L 29/4908* (2013.01); *H01L 29/66969* (2013.01); *H01L 29/78606* (2013.01); *H01L 29/78618* (2013.01); *H01L 29/78696* (2013.01); *H01L 21/02565* (2013.01); *H01L 21/02664* (2013.01)

(56) References Cited

U.S. PATENT DOCUMENTS

| | | | |
|---|---|---|---|
| 5,903,014 A * | 5/1999 | Ino et al. | 257/66 |
| 6,410,961 B1 * | 6/2002 | Hayashi | H01L 27/12 257/294 |
| 6,429,457 B1 | 8/2002 | Berggren et al. | |
| 6,451,636 B1 * | 9/2002 | Segawa et al. | 438/166 |
| 6,486,514 B2 * | 11/2002 | Jeong | H01L 23/53242 257/350 |
| 6,628,363 B1 * | 9/2003 | Sano | H01L 27/12 257/E27.111 |
| 7,132,687 B2 * | 11/2006 | Kawasaki et al. | 257/59 |
| 7,211,825 B2 * | 5/2007 | Shih | H01L 29/78633 257/13 |
| 7,348,221 B2 | 3/2008 | Bromberger | |
| 7,411,298 B2 | 8/2008 | Kawakami et al. | |
| 7,527,994 B2 * | 5/2009 | Sarma | H01L 29/458 257/E21.158 |
| 7,696,036 B2 | 4/2010 | Bu et al. | |
| 7,897,445 B2 | 3/2011 | Chang et al. | |
| 7,977,750 B2 * | 7/2011 | Kitakado et al. | 257/350 |
| 7,993,964 B2 * | 8/2011 | Hirao et al. | 438/104 |
| 8,067,772 B2 * | 11/2011 | Ikeda | H01L 27/12 257/350 |
| 8,367,489 B2 | 2/2013 | Yamazaki | |
| 8,759,917 B2 * | 6/2014 | Park et al. | 257/347 |
| 8,841,665 B2 * | 9/2014 | Park et al. | 257/43 |
| 9,230,985 B1 | 1/2016 | Wu et al. | |
| 9,401,430 B1 | 7/2016 | Ellinger et al. | |
| 9,564,478 B2 | 2/2017 | Chang et al. | |
| 2004/0086807 A1 * | 5/2004 | Peng | H01L 29/66765 430/317 |
| 2005/0270259 A1 * | 12/2005 | Shirasaki | H01L 27/3279 345/76 |
| 2006/0175609 A1 | 8/2006 | Chan et al. | |
| 2006/0214198 A1 * | 9/2006 | Matsuki | H01L 21/28176 257/288 |
| 2007/0034871 A1 * | 2/2007 | Itoh | H01L 29/78675 257/59 |
| 2007/0281400 A1 * | 12/2007 | Yamazaki | H01L 21/28273 438/151 |
| 2008/0136990 A1 * | 6/2008 | Kimura | 349/46 |
| 2008/0277657 A1 * | 11/2008 | Jeong | H01L 29/66969 257/43 |
| 2010/0181575 A1 * | 7/2010 | Makita | H01L 29/78618 257/72 |
| 2011/0049511 A1 * | 3/2011 | Yano | H01L 29/7869 257/43 |
| 2011/0062433 A1 * | 3/2011 | Yamazaki | H01L 27/1225 257/43 |
| 2011/0095288 A1 * | 4/2011 | Morosawa | H01L 29/7869 257/43 |
| 2012/0161124 A1 | 6/2012 | Yamazaki et al. | |
| 2013/0077012 A1 * | 3/2013 | Tada | H01L 27/1255 349/43 |
| 2013/0181214 A1 | 7/2013 | Yamazaki et al. | |
| 2014/0015067 A1 | 1/2014 | Pushkar et al. | |
| 2014/0103307 A1 | 4/2014 | Chang et al. | |
| 2014/0138682 A1 * | 5/2014 | Saito | H01L 27/1225 257/43 |
| 2014/0151708 A1 * | 6/2014 | Jeon et al. | 257/72 |
| 2014/0252454 A1 | 9/2014 | Rabkin et al. | |
| 2015/0069320 A1 | 3/2015 | Rabkin et al. | |
| 2015/0179811 A1 * | 6/2015 | Kanno | H01L 29/66765 257/43 |
| 2015/0221775 A1 | 8/2015 | Yamazaki et al. | |
| 2015/0311256 A1 | 10/2015 | Rabkin et al. | |
| 2016/0233338 A1 | 8/2016 | Lu et al. | |
| 2016/0351722 A1 | 12/2016 | Zhou et al. | |

FOREIGN PATENT DOCUMENTS

| | | |
|---|---|---|
| CN | 103426740 A | 12/2013 |
| CN | 104332485 A | 2/2015 |
| CN | 105408813 A | 3/2016 |
| TW | 201334083 A | 8/2013 |

OTHER PUBLICATIONS

Woon, et al, "Vertical organic field effect phototransistor with two dissimilar source and drain contacts," ScienceDirect vol. 562, pp. 525-529, Jul. 1, 2014.

J.-S. Park, et al., Improvements in the device characteristics of amorphous indium gallium zinc oxide thin-film transistors by Ar plasma treatment,: Appl. Phys. Lett. 90, 262106 (2007).

M. Kim, et al., "High mobility bottom gate InGaZnO thin film transistors with Si O x etch stopper",: Appl. Phys. Lett. 90, 212114 (2007).

J.S. Park, et al., "Review of recent developments in amorphous oxide semiconductor thin-film transistor devices," Thin Solid Films 520, 1679 (2012).

R. Chen, et al., "Self-aligned indium-gallium-zinc oxide thin-film transistor with phosphorus-doped source/drain regions," IEEE Electron Device Lett. 33, 1150 (2012).

A. Sato, et al., "Amorphous In—Ga—Zn—O thin-film transistor with coplanar homojunction structure," Thin Solid Films 518, 1309 (2009).

L. Li, et al., "Effect of thermal annealing on the properties of transparent conductive In—Ga—Sn oxide thin films" Vac. Sci. Technol. A Vacuum, Surfaces, Film. 32, 021506 (2014).

T. Kamiya, et al., "Origins of high mobility and low operation voltage of amorphous oxide TFTs: Electronic structure, electron transport, defects and doping," J. Disp. Technol. 5, 468 (2009).

B. Du Ahn, et al., "Comparison of the effects of Ar and H2 plasmas on the performance of homojunctioned amorphous indium gallium zinc oxide thin film transistors," Appl. Phys. Lett. 93, 203506 (2008).

R. Chen, et al., "Self-aligned indium-gallium-zinc oxide thin-film transistors with SiNx/SiO2/SiNx/SiO2 passivation layers" Thin Solid Films 4 (2014).

J. Y. Kwon, et al., "Bottom-Gate Gallium Indium Zinc Oxide Thin-Film Transistor Array for High-Resolution AMOLED Display," IEEE Electron Device Lett., vol. 29, No. 12, pp. 1309-1311, Dec. 2008.

J. H. Na et al., "High field-effect mobility amorphous InGaZnO transistors with aluminum electrodes," Appl. Phys. Lett., vol. 93, No. 6, p. 063501, 2008.

J. K. Jeong, et al., "12.1-in. WXGA AMOLED display driven by InGaZnO thin-film transistors," J. Soc. Inf. Disp., vol. 17, No. 2, p. 95, 2009.

W.-S. Kim, et al., "An investigation of contact resistance between metal electrodes and amorphous gallium-indium-zinc-oxide (a-GIZO) thin-film transistors," Thin Solid Films, vol. 518, No. 22, pp. 6357-6360, Sep. 2010.

C.-T. Tsai, et al., "Influence of positive bias stress on N2O plasma improved InGaZnO thin film transistor," Appl. Phys. Lett., vol. 96, No. 24, p. 242105, 2010.

Y. Ono, S. Kishimoto, et al., "Thin film transistors using PECVD-grown carbon nanotubes.," Nanotechnology, vol. 205202, No. 20, p. 205202, May 2010.

S. H. Ryu, et al., "Amorphous-InGaZnO4 Thin-Film Transistors with Damage-Free Back Channel Wet-Etch Process," ECS Solid State Lett., vol. 1, No. 2, pp. Q17-Q19, Jul. 2012.

(56) References Cited

OTHER PUBLICATIONS

J. C. Park, et al., "High-performance low-cost back-channel-etch amorphous gallium-indium-zinc oxide thin-film transistors by curing and passivation of the damaged back channel.," ACS Appl. Mater. Interfaces, vol. 5, No. 23, pp. 12262-12267, Dec. 2013.

J. G. Urn, et al., "P-7: High Speed a-IGZO TFT-based Gate Driver by using Back Channel Etched Structure," SID Symp. Dig. Tech. Pap., vol. 45, No. 1, pp. 968-971, Jun. 2014.

A. Hino, et al., "Effects of thermal annealing on variations of electron traps in the channel region of amorphous In—Ga—Zn—O thin film transistor," J. Vac. Sci. Technol. B Microelectron. Nanom. Struct., vol. 32, No. 3, p. 031210, May 2014.

T. Kamiya, et al., "Present status of amorphous In—Ga—Zn—O thin-film transistors," Sci. Technol. Adv. Mater., vol. 11, No. 4, p. 044305, Aug. 2010.

Rha et al., "Vertically integrated submicron amorphous-In2Ga2ZnO7 thin film transistor using a low temperature process," 2012, Applied Physics Letters, vol. 100, American Institute of Physics, 6 pages.

Jin, et al., "Simple Fabrication of a Three-Dimensional CMOS Inverter Using p-Type Poly-Si and n-Type Amorphous Ga-In-Zn-O thin-Film Transistors," IEEE Electron Device Letters, Vol. 32, No. 9, Sep. 2011, 3 pages.

Kamiya, et al., "Present status of amorphous In-Ga-Zn-O thin-film transistors," Sci. Technol. Adv. Mater. 11(2010) 044305, 23 pages.

Lih, et al., "Comparison of a-Si and Poly-Si for AMOLED displays," J. Soc. Inf. Disp. 12, 367 (2004), 5 pAGES.

Office Action dated Mar. 12, 2018 for U.S. Appl. No. 15/581,322, 81 pages.

\* cited by examiner

METAL OXIDE THIN FILM TRANSISTOR WITH CHANNEL, SOURCE AND DRAIN REGIONS RESPECTIVELY CAPPED WITH COVERS OF DIFFERENT GAS PERMEABILITY

RELATED APPLICATION

This application claims priority to U.S. Provisional Patent Application No. 61/967,970, filed on Mar. 31, 2014, and entitled "METAL-OXIDE THIN-FILM TRANSISTOR WITH CHANNEL, SOURCE AND DRAIN REGIONS CAPPED WITH COVERS OF DIFFERENT GAS-PERMEABILITY AND METHOD OF FABRICATING THE SAME." The entirety of the aforementioned application is incorporated by reference herein.

TECHNICAL FIELD

This disclosure relates generally to metal oxide thin film transistors with channel, source and drain regions respectively capped with covers of different gas permeability and a method for fabricating the same.

BACKGROUND

A thin-film transistor (TFT) consists of a channel region located between source and drain (S/D) regions. The resistance of the channel is modulated by the voltage on the gate electrode, while that of the S/D regions is not. For a conventional metal-oxide (MO) TFT, Schottky barriers are formed at the junctions where the S/D conductors contact the metal oxide layer (e.g., indicated by lines 101 of FIG. 1). The resistance associated with such a junction is high, resulting in lowering of the on-state current. Accordingly mechanisms to reduce the resistance of the S/D regions are desired. In some aspects, high resistance associated with the Schottky barrier can be reduced if the conductivity of the MO region under the S/D conductor coverage is increased. Existing techniques for increasing the conductivity of the S/D regions incorporate extrinsic dopants in the MO of the S/D by plasma treatment or ion implantation. These existing techniques are associated with various drawbacks. For example, hydrogen can be doped into the MO using the plasma treatment but it is thermally unstable. Other relatively stable extrinsic dopants, such as boron and phosphorus, require a relatively expensive ion implantation process and an additional activation annealing.

The above-described deficiencies of conventional MOTFT devices are merely intended to provide an overview of some of problems of current technology, and are not intended to be exhaustive. Other problems with the state of the art, and corresponding benefits of some of the various non-limiting embodiments described herein, may become further apparent upon review of the following detailed description.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
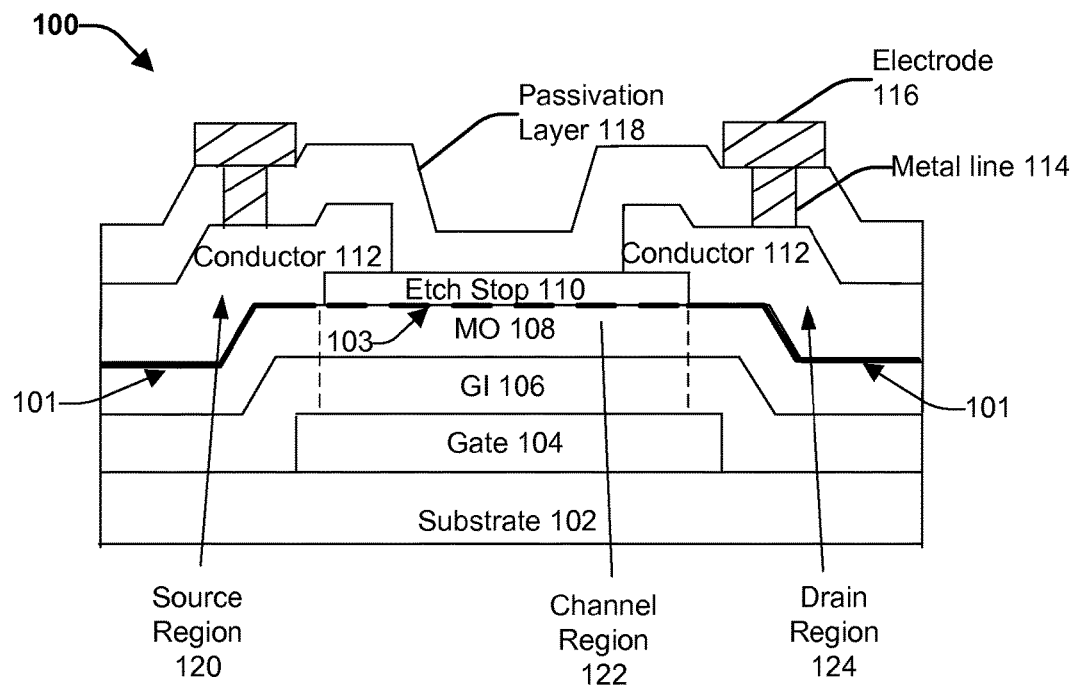
FIG. 1 presents a cross-sectional view of a prior art structure of a conventional MOTFT device.

Various aspects or features of this disclosure are described with reference to the drawings, wherein like reference numerals are used to refer to like elements throughout. In this specification, numerous specific details are set forth in order to provide a thorough understanding of the subject disclosure. It should be understood, however, that the certain aspects of this disclosure may be practiced without these specific details, or with other methods, components, materials, etc. In other instances, well-known structures and devices are shown in block diagram form to facilitate describing the subject disclosure.

By way of introduction, the subject matter disclosed herein relates to TFTs wherein the resistivity ($\rho$) of a MO active area, (the channel, source and drain regions), is modulated by capping the active area with covers of different gas permeability and performing thermal annealing. The subject technique is used to form traditional MOTFTs with low ($\rho$) S/D regions and a high ($\rho$) channel region a well as junctionless TFTs wherein the entire active area has a low ($\rho$).

The subject TFTs can have highly conductive S/D regions that are formed without the need of a deliberate doping process, such as plasma treatment or ion implantation. This is accomplished by capping the S/D regions of the MO active layer with a gas-impermeable cover and capping the channel region with a gas permeable cover (or leaving the channel region exposed), and performing an annealing processes (e.g., thermal processing) under an oxidizing ambience or a non-oxidizing ambience. This process reduces the initial conductivity of the channel region while increasing the initial conductivity of the S/D region, thus increasing the performance of the device.

When thermal processing is performed on conventional MOTFTs in an oxidizing ambience, both the resistivity of S/D region-covered MO and the resistance associated with the Schottky barriers are increased, having a deleterious effect of lowering of the on-state current. On the other hand, when thermal processing is performed on conventional MOTFTs in a non-oxidizing ambience, the conductivity of the channel is increased, having a deleterious effect of increasing the off-state leakage current. Low conductivity/high resistance is generally preferred for the channel region of a MOTFT while high conductivity/low resistance is preferred for the S/D regions. Since thermal processing is inevitable for the fabrication of a MOTFT, such conflict on the preferred heat-treatment ambience for the S/D and the channel regions inevitably limits the performance of the device.

In accordance with one or more embodiments described herein, heat treatment is performed on a traditional MOTFT structure in an oxidizing ambience having the S/D regions capped with a gas-impermeable seal or cover, resulting in a low conductivity channel region and high conductivity S/D regions. Alternatively, heat treatment can be performed in a non-oxidizing ambience, but at a temperature below a characteristic conductivity transition-temperature. With the subject technique, one oxidizing heat treatment is performed to simultaneously enhance the conductivity of the S/D regions and maintain the high resistance of the channel region, thus enhancing the performance of the resulting MOTFT.

Various additional embodiments are directed to junctionless TFTs that are fabricated using a single annealing treatment to form an active area with a low ($\rho$). In accordance with these embodiments, the ($\rho$) of the entire MO active area of a junctionless TFT is reduced by annealing the MO active area in an oxidizing or non-oxidizing ambience while the active area is left exposed, covered with a gas-impermeable cover, or covered with a gas permeable cover. For example, in some embodiments, the entire active layer is covered with an impermeable cover and annealed in either oxidizing or non-oxidizing ambience, thereby modulating the resistivity of the entire active layer. In other embodiments, the active layer is covered entirely or partially (e.g., either the S/D regions or the channel region) with a gas permeable cover or left exposed/uncovered. The active layer is then annealed in a non-oxidizing ambience thereby modulating the resistivity of the active layer.

Compared with the use of extrinsic dopants, this stable resistivity modulation technique is simpler and requires a single heat-treatment step at a moderate temperature. Such process simplification leads to reduced fabrication cost. In addition, the subject techniques result in the fabrication of an MOTFT with ohmic S/D contacts. Compared with the Schottky barrier S/D contacts of the conventional MOTFTs, the subject ohmic S/D contacts lead to reduced parasitic contact and S/D resistance, hence improved device performance.

In one or more embodiments, a transistor structure is provided, that includes an active layer comprising MO formed on a substrate, a gate stack adjacent to the active layer, the gate stack comprising a gate dielectric layer adjacent to the active layer and a gate electrode adjacent to the gate dielectric layer, a channel region provided within the active layer adjacent to the gate stack, source and drain regions provided within the active layer respectively on opposite sides of the channel, and a gas-impermeable layer provided on and adjacent to the source and drain regions.

In another embodiment, a method is disclosed that includes forming an active layer comprising MO on a substrate, forming an impermeable layer on a first side of the active layer, the impermeable layer comprising a material that is impermeable to oxygen containing species, annealing the active layer with the impermeable layer thereon, and reducing resistivity of the active layer based on the annealing.

In another embodiment, an apparatus is disclosed that includes a substrate, source and drain regions within an annealed active layer having resulted from an annealing of an active layer comprising MO and formed on the substrate, and an impermeable layer over the source and drain regions of the annealed active layer, the impermeable layer comprising a material that is impermeable to oxygen containing species. In accordance with this aspect, the annealing resulting in the annealed active layer was performed with the impermeable layer over portions of the active layer corresponding to the source and drain regions, thereby resulting in a reduction of a resistivity of the source and drain regions of the annealed active layer relative to the active layer.

In various additional embodiments, a junctionless transistor is provided that includes a substrate, an annealed active layer having resulted from an annealing of an active layer comprising metal-oxide and formed on the substrate, and an impermeable layer formed on and adjacent to the annealed active layer, the impermeable layer comprising a material that is impermeable to oxygen containing species. The annealing resulting in the annealed active layer was performed with the impermeable layer over the active layer, thereby resulting in a reduction of a resistivity of the annealed active layer relative to the active layer. In an aspect, the annealing was performed under an oxidizing ambience. In another aspect, the annealing was performed in a non-oxidizing ambience.

In another embodiment, a junctionless transistor is provided that includes a substrate, an annealed active layer having resulted from an annealing of an active layer comprising metal-oxide and formed on the substrate, and a permeable layer formed on and adjacent to the annealed active layer, the permeable layer comprising a material that is permeable to oxygen containing species. The annealing resulting in the annealed active layer was performed in a non-oxidizing ambience with the permeable layer over the active layer, thereby resulting in a reduction of a resistivity of the annealed active layer relative to the active layer.

In another embodiment, a junctionless transistor is provided that includes a substrate, an annealed active layer having resulted from an annealing of an active layer comprising metal-oxide and formed on the substrate, and the annealed active layer is uncovered. The annealing resulting in the annealed active layer was performed in a non-oxidizing ambience with the active layer being uncovered, thereby resulting in a reduction of a resistivity of the annealed active layer relative to the active layer.

In another embodiment, a junctionless transistor is provided that includes a substrate, an annealed active layer having resulted from an annealing of an active layer comprising metal-oxide and formed on the substrate, a permeable layer formed on and adjacent to a portion of the annealed active layer, the permeable layer comprising a material that is permeable to oxygen containing species. The annealing resulting in the annealed active layer was performed in a non-oxidizing ambience with the permeable layer on and adjacent to the portion of the active layer, thereby resulting in a reduction of a resistivity of the annealed active layer relative to the active layer.

In yet another embodiment, a junctionless transistor is provided that includes a substrate, an annealed active layer having resulted from an annealing of an active layer comprising metal-oxide and formed on the substrate, and the annealed active layer is partially uncovered. The annealing resulting in the annealed active layer was performed in a non-oxidizing ambience with the active layer partially uncovered, thereby resulting in a reduction of a resistivity of the annealed active layer relative to the active layer.

With reference initially to FIG. 1, presented is a cross-sectional view of a conventional inverted-staggered MOTFT device 100. The conventional inverted-staggered MOTFT device includes a gate electrode 104 provided on a substrate 102. The gate electrode is covered with a gate insulator (GI) layer 106 and an active MO semiconductor layer 108 is provided over the gate insulator layer 106. S/D regions, (source region 120 and drain region 124), are respectively established with the conductors 112 deposited above the active MO layer 108 while a channel region 122 is established with the active MO layer 108 between the S/D regions above the gate electrode 104. The S/D regions, (source region 120 and drain region 124) are respectively connected to source and drain electrodes 116 via metal lines 114, respectively. A passivation layer 118 can be provided between the S/D regions and the source and drain electrodes 116.

With the traditional inverted-staggered MOTFT device 100, the resistance of the channel region 122 is modulated by the voltage on the gate electrode, while that of the S/D regions is not. Schottky barriers are formed at the junctions where the S/D conductors 112 contact the MO layer 108 (e.g., indicated by lines 101). The resistance associated with such a junction is high and can be reduced if the conductivity of the MO layer under the S/D coverage region is increased. This is conventionally accomplished by integrating external dopants within the source and drain regions by plasma treatment or ion implantation. For example, hydrogen can be doped into the MO using the plasma treatment but it is thermally unstable. Other relatively stable extrinsic dopants, such as boron and phosphorus, require a relatively expensive ion implantation process and an additional activation annealing.

In addition, with the traditional inverted-staggered MOTFT device 100, the channel region 122 surface (e.g., indicated by dashed line 103) suffers damage or is even partially removed during etching of S/D regions 120 and 124, thus requiring an additionally patterned etch-stop layer 110 to protect the channel region 122 from being etched.

Figure 2A:
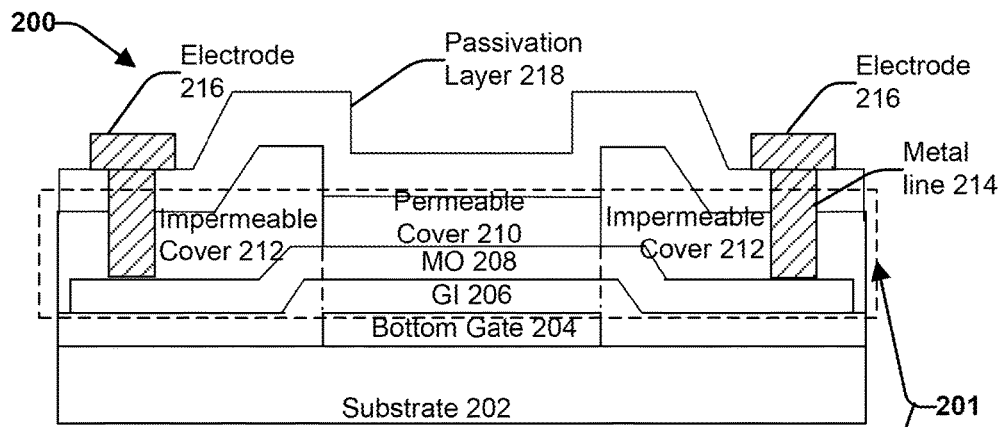
FIG. 2A presents a channel length cross-sectional view of an example bottom gate MOTFT device having source and drain regions capped with gas impermeable covers in accordance with aspects and embodiments described herein.

FIG. 2A presents a channel length cross-sectional view of an example bottom gate MOTFT device 200 having source and drain regions capped with gas impermeable covers in accordance with aspects and embodiments described herein. FIG. 2C presents another cross-sectional view of example bottom gate MOTFT device 200 taken along the channel width. Device 200 includes a bottom gate electrode 204 provided on a substrate 202. The substrate material can vary. In an aspect, the substrate 202 includes an oxidized silicon wafer. In another aspect, the substrate 202 can include a transparent material (e.g., glass). In yet another aspect, the substrate 202 can include a flexible material (e.g., polymeric substrate). The material of the bottom gate electrode 204 can include a conducting material, such as a metal (e.g., molybdenum or titanium). In an aspect, the conductivity of most metals decreases during thermal oxidation and annealing. Thus in an aspect, the material of the gate electrode 204 includes a conducting material that is substantially resistant to oxidizing and annealing, such as indium-tin oxide (ITO). In another aspect, the substrate 202 and the bottom gate electrode 204 can be unified. For example, a heavily doped silicon wafer substrate can serve as the bottom gate electrode. For instance, the silicon wafer 202 can be doped with N-type or P-type atoms at a concentration between $1\times10^{18}$ cm$^{-3}$ and $1\times10^{21}$ cm$^{-3}$.

The bottom gate electrode 204 is covered with a gate insulator (GI) layer 206 and an active (MO) semiconductor layer 208 is provided over and adjacent to the gate insulator layer 206. The material of the GI layer 206 can vary. In an aspect, the gate insulating material includes thermal oxide. In another aspect, the GI layer 206 includes a gas permeable material (e.g., silicon oxide or silicon dioxide ($SiO_2$)). The thickness of the GI layer 206 can vary. In an aspect, the GI 206 has a thickness of about 10 (nm) nanometers to about 2000 nm. In another aspect, the GI layer 206 has a thickness of about 50 nm to about 1000 nm. In another aspect, the GI layer 206 has a thickness of about 50 nm to about 1000 nm. In another aspect, the gate insulator layer 206 has a thickness of about 100 nm to about 200 nm.

The active MO semiconductor layer 208 includes the S/D regions and the channel regions of the MOTFT device 200. The active MO layer can include a MO semiconductor material, such as but not limited to: zinc oxide, zinc oxynitride, indium-zinc oxide, indium-gallium-zinc oxide, zinc-tin oxide, tin oxide, indium oxide, copper oxide, uranium oxide, bismuth oxide, barium titanate, strontium titanate, and lithium niobate. In an exemplary embodiment, the active MO semiconductor layer 208 includes zinc oxide ($ZnO_x$) or indium gallium zinc oxide (IGZO). The thickness of the active MO layer 208 can vary. In an aspect, the thickness of the active MO layer 208 ranges from about 10 nm to about 1000 nm. In another aspect, the thickness of the active MO layer 208 ranges from about 50 nm to about 500 nm. In yet another aspect, the thickness of the active MO layer 208 ranges from about 100 nm to about 150 nm.

A channel region 222 is established within a middle region/portion of the the active MO layer 208 located above the bottom gate electrode 204 while the S/D regions (source region 220 and drain region 224) are respectively established within the active MO layer 208 on opposite sides of the channel region 222.

Figure 2B:
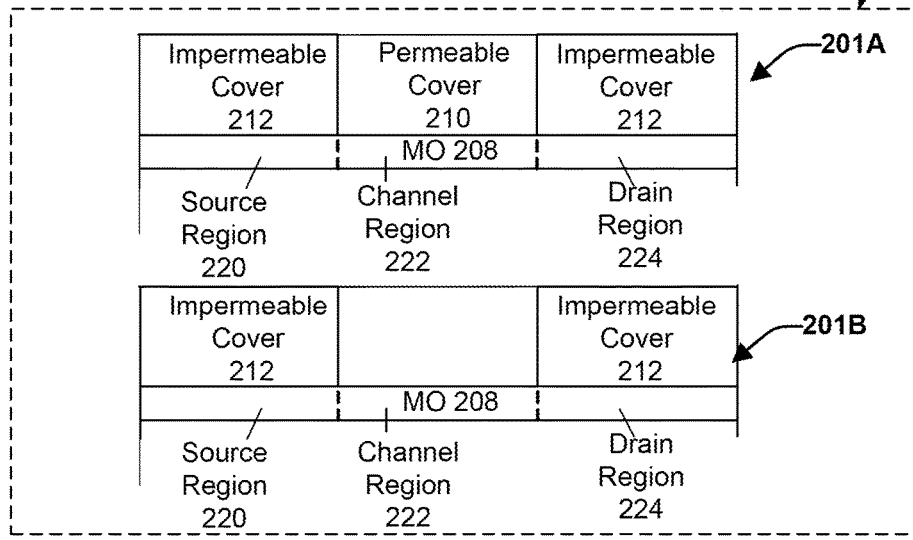
FIG. 2B presents a call out box with an enlarged view of a portion of an MOTFT device identifying the source region, the drain region and the channel region in accordance with aspects and embodiments described herein.
Figure 2C:
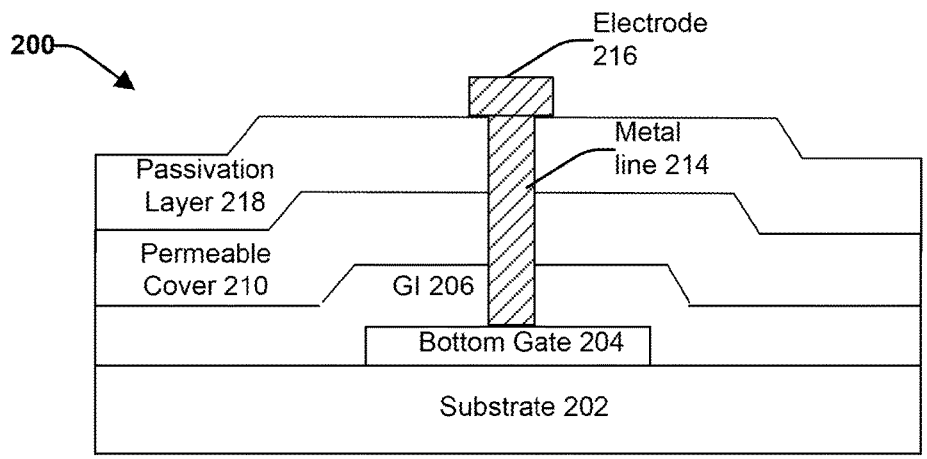
FIG. 2C presents a channel width cross-sectional view of an example bottom gate MOTFT device having source and drain regions capped with gas impermeable covers in accordance with aspects and embodiments described herein.

FIG. 2B presents call out box 201 with an enlarged view of a portion of the MOTFT device 200 identifying the source region 220, the drain region 224 and the channel region 222. Unlike the conventional MOTFT device 100, the S/D regions of device 200 are not conductors 112 deposited over the MO layer 108 and subsequently etched. On the contrary, the S/D regions of device 120 are established within the MO layer 108 as a result of an annealing process with the S/D regions being respectively covered with impermeable covers 212. Thus device 200 does not include the Schottky barriers established within device 100 and does not require deposition and etching of a conductor layer to form S/D regions. The impermeable covers 112 include a material that is impermeable to gas, particularly oxygen carrying species and respectively seal the S/D regions (e.g., source region 220 and drain region 224).

In an aspect, the material of the impermeable covers 212 can respectively include either one single impermeable layer or a stack of multiple layers consisting of at least one impermeable layer formed with a gas-impermeable material, including but not limited to: silicon nitride, aluminium oxide, silicon, or metals such as titanium, aluminum molybdenum, copper, silver, gold, nickel, tungsten, chromium, hafnium, platinum, iron and their alloys. In an aspect, the impermeable layer can include an impermeable insulator, such as silicon nitride ($SiN_y$). In another aspect, the impermeable layer can include an impermeable conductor, such as titanium or aluminum. In one embodiment, the impermeable covers 212 respectively include a single impermeable layer of $SiN_y$. In another embodiment, the impermeable covers 212 respectively include a layer of $SiO_x$ and a layer of $SiN_y$. The thickness of the impermeable covers 212 can vary. In an aspect, the impermeable covers 212 have a thickness ranging from about 10 nanometers (nm) to about 1000 (nm). In another aspect, the impermeable covers 212 have a thickness of about 50 nm to about 500 nm. Still in yet another aspect, the impermeable covers have a thickness of about 100 nm to about 200 nm.

In an aspect, the channel region 222 is covered with a permeable cover 210, as exemplified in structure 201A. In another aspect, the channel region 220 is left bare or exposed, as exemplified in structure 201B. According to this aspect, a passivation layer 218 deposited over device 200 will cover the impermeable covers 212 and the permeable cover 210 (or the channel region 222 when no permeable cover is included). The permeable cover 210 can include a material that is permeable to gas, particularly oxygen carrying species. The permeable cover 210 can be either one single permeable layer or a stack of multiple permeable layers. In an aspect, the permeable layer includes a permeable insulator, such as silicon oxide. In another aspect, the permeable cover 210 includes a permeable conductor, such as indium-tin oxide. The thickness of the permeable cover can vary. In an aspect, the permeable cover 210 has a thickness ranging from about 10 nm to about 2000 nm. In another aspect, the permeable cover 210 has a thickness ranging from about 100 nm to about 1000 nm. Still in yet another aspect, the permeable cover 210 has a thickness ranging from about 150 nm to about 500 nm.

MOTFT Device 200 further includes electrodes 216 (e.g., source and drain electrodes) respectively connected to the source and drain regions (e.g., source regions 220 and drain region 224, respectively), via metal lines 214 formed within contact holes, thus establishing ohmic S/D contacts (e.g., as depicted in FIG. 2A). Another electrode 216 (e.g., a gate electrode) can be connected to the bottom gate 204 via a metal line 214 formed within another contact hole through the passivation layer 218, the permeable cover 210, and the GI layer 206, as shown in FIG. 2C. In an aspect, the electrodes 216 include metal (e.g., aluminum). Compared with the Schottky barrier S/D contacts of the conventional MOTFT device 100, the subject ohmic S/D contacts lead to reduced parasitic contact and S/D resistance, hence improved device performance. Device 200 further includes a passivation layer 218 provided over and adjacent to the impermeable covers 212 and the permeable cover 210 (or the channel region 222 when no permeable cover is included) and between the impermeable covers 212 and the permeable cover 210 (or the channel region 222 when no permeable cover is included) and the electrodes 216. The passivation layer 218 serves to protect the source region 220, the drain region 224 and especially the channel region 222.

In accordance with an embodiment, the active MO semiconductor layer 208 is not doped with any external dopants. In other aspects, the MO active layer can have a low initial doping concentration (e.g., less than about $1 \times 10^{15}$ $cm^{-3}$). The source and drain regions of the MO active layer 208 however has a low resistivity (or high conductivity) having resulted from heat treatment (e.g., thermal annealing) of the MO active layer 208 with the impermeable cover provided thereon, despite being undoped (or having the low doping concentration). In addition, the resistivity of the channel region 222 keeps its initial native material high resistivity (e.g., its resistivity before annealing) or has a resistivity higher than its initial resistivity based on annealing of the MO active layer 208 with a permeable cover 210 (or no permeable cover) provided thereon. Thus the electrically properties of the S/D regions and the channel region of MOTFT device 200 are a function of being thermally annealed with the impermeable covers 212 provided over and adjacent to the S/D regions (regions 220 and 224) and the permeable cover 210 (or no cover) provided over the channel region 222.

In an aspect, the MO active layer 208 has been thermally treated/annealed in an oxidizing ambience (e.g., under $O_2$) at a temperature greater than 100° C. for a duration between 10 seconds and 10 hours while the S/D regions were covered with impermeable covers 212 and the channel region was covered with permeable cover 210 (or left exposed). In another aspect, the temperature at which the MO active layer 208 was thermally annealed in an oxidizing ambience was greater than 300° C. In another aspect, the temperature at which the MO active layer 208 was thermally annealed in an oxidizing ambience was greater than 400° C. In another aspect, the temperature at which the MO active layer 208 was thermally annealed in an oxidizing ambience was greater than 500° C. In yet another aspect, the temperature at which the MO active layer 208 was thermally annealed in an oxidizing ambience was between 100° C. and 1000° C. In yet another aspect, the temperature at which the MO active layer 208 was thermally annealed in an oxidizing ambience was between 100° C. and 800° C. In yet another aspect, the temperature at which the MO active layer 208 was thermally annealed in an oxidizing ambience was between 300° C. and 1000° C. In yet another aspect, the temperature at which the MO active layer 208 was thermally annealed in an oxidizing ambience was between 300° C. and 800° C. In yet another aspect, the temperature at which the MO active layer 208 was thermally annealed in an oxidizing ambience was between 400° C. and 1000° C. Still in yet another aspect, the temperature at which the MO active layer 208 was thermally annealed in an oxidizing ambience was between 400° C. and 800° C.

In another aspect, the active MO layer 208 has been thermally treated/annealed in a non-oxidizing ambience (e.g. $N_2$) at a temperature between 100° C. and 800° C. for a duration between 10 seconds and 10 hours while the S/D regions were covered with impermeable covers 212 and the channel region was covered with permeable cover 210 (or left exposed). In another aspect, the temperature at which the MO active layer 208 was thermally annealed in a non-oxidizing ambience was between 100° C. and 500° C. In another aspect, the temperature at which the MO active layer 208 was thermally annealed in anon-oxidizing ambience was between 100° C. and 400° C. In another aspect, the temperature at which the MO active layer 208 was thermally annealed in a non-oxidizing ambience was between 100° C. and 300° C. In yet another aspect, the temperature at which the MO active layer 208 was thermally annealed in a non-oxidizing ambience was between 200° C. and 800° C. In yet another aspect, the temperature at which the MO active layer 208 was thermally annealed in a non-oxidizing ambience was between 200° C. and 500° C. In yet another aspect, the temperature at which the MO active layer 208 was thermally annealed in a non-oxidizing ambience was between 200° C. and 400° C. Still in yet another aspect, the temperature at which the MO active layer 208 was thermally annealed in a non-oxidizing ambience was between 200° C. and 300° C.

The annealed active MO layer 208, having been annealed under the conditions noted above, has a low resistance in regions that are covered with the impermeable cover 212 (e.g., the S/D regions) and a high resistance in regions not covered with the impermeable cover and/or covered with a permeable cover (e.g., the channel region 222). For example, based on establishment under the oxidizing or non-oxidizing conditions described above, the S/D regions (e.g., source region 220 and drain region 224 can respectively have a resistivity between about $10^0$ Ω·cm and $10^{-2}$ Ω·cm while remaining undoped or having a low doping concentration. In another example, the S/D regions can respectively have a resistivity between about $10^{-1}$ Ω·cm and $10^{-2}$ Ω·cm while remaining undoped or having a low doping concentration. Still in yet another example, the S/D regions can respectively have a resistivity less than or equal to about $10^{-2}$ Ω·cm while remaining undoped or having a low doping concentration.

In addition, based on establishment under the non-oxidizing conditions described above, the channel region 222 can have a resistivity between $10^0$ Ω·cm and $10^4$ Ω·cm. In one example, based on establishment under the non-oxidizing conditions described above, the channel region can have a resistivity between $10^{-1}$ Ω·cm and $10^0$ Ω·cm when left exposed. In some aspects, based on establishment under the non-oxidizing conditions described above, the channel region can have a higher resistivity when covered with permeable cover 210 as opposed to being exposed. For example, when covered with permeable cover 210 including a material with oxidizing agents (e.g., $SiO_x$) and subjected to non-oxidizing annealing, the channel region 222 can have a resistivity between $10^1$ Ω·cm and $10^4$ Ω·cm. In another example, based on establishment under the non-oxidizing conditions described above, the channel region can have a resistance between $10^0$ Ω·cm and $10^4$ Ω·cm when left exposed and between $10^0$ Ω·cm and $10^4$ Ω·cm when covered with permeable cover 210. Further, based on establishment under the oxidizing conditions described above, the channel region can have a resistance similar to or even greater than its initial native resistivity (e.g., greater than or about equal to $10^4$ Ω·cm).

Figure 3:
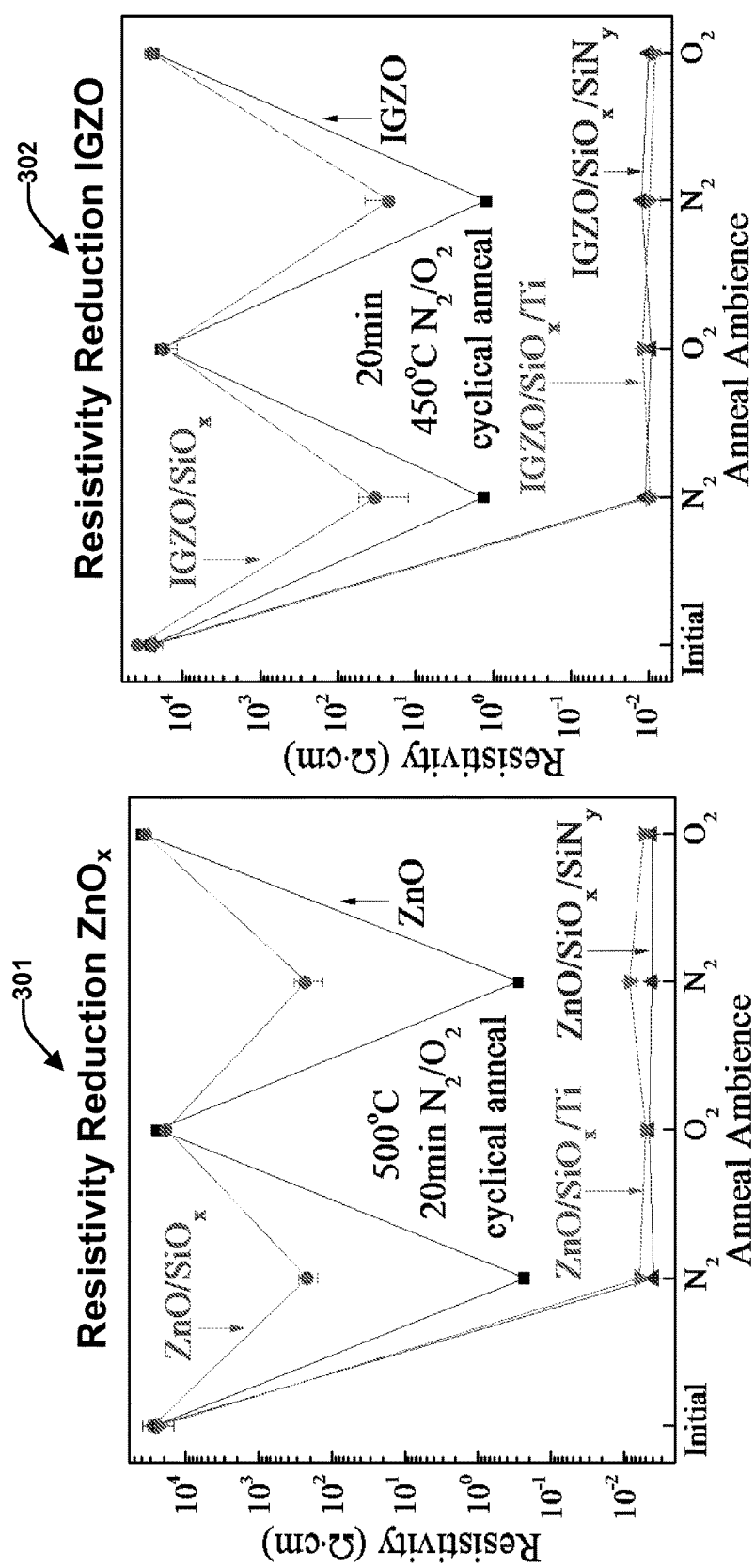
FIG. 3 provides graphs demonstrating the dependence of the resistivity on the annealing ambience ($O_2$ and $N_2$) for ZnO and IGZO when capped with different covers, in accordance with various aspects and embodiments described herein FIG. 4 provides graphs demonstrating the dependence of the resistivity on the annealing temperature for ZnO and IGZO capped with different covers, in accordance with various aspects and embodiments described herein.

FIG. 3 provides graphs 301 and 302 demonstrating the dependence of the resistivity on the annealing ambience ($O_2$ and $N_2$) for ZnO and IGZO when capped with different covers (including $SiO_x$, $SiO_x/SiN_y$, $SiO_x/Ti$ and bare or no cover), in accordance with various aspects and embodiments described herein. As shown in graphs 301 and 302, the resistivity of bare MO (ZnO or IGZO) and MO covered with permeable $SiO_x$ changes with the cyclical alternation of the ambience, while the resistivity of MO covered with the impermeable $SiO_x/SiN_y$ or $SiO_x/Ti$ double-layer decreases to the same low level for both $N_2$ and $O_2$ annealing, indicating a thermally stable conductive MO, even in an oxidizing ambience. Furthermore, its resistivity is even lower or at least comparable than that induced by the aforementioned doping processes, such as the plasma bombardment or the ion implantation.

For example, with reference to graph 301, when thermal annealing is performed on ZnO when sealed with an impermeable cover including a layers of $SiO_x/SiN_y$ or $SiO_x/Ti$ at a temperature of about 500° C. in a non-oxidizing ambiance $N_2$ or oxidizing ambience $O_2$, the initial resistivity of ZnO decreases from about $10^4$ Ω·cm to less than about $10^{-2}$ Ω·cm, a resistivity reduction by 7 orders. This decrease in resistivity is substantially the same for both a non-oxidizing ambience of $N_2$ and an oxidizing ambience of $O_2$. Furthermore, its resistivity is decreased to an amount even lower or at least comparable to that induced by the aforementioned doping processes, such as the plasma bombardment or the ion implantation.

On the contrary, the resistivity reduction for bare ZnO (when not sealed with an impermeable cover) is much less than that of ZnO when covered with an impermeable seal. In particular, the resistivity reduction for bare ZnO decreases from $10^4$ Ω·cm to about $10^{-1}$ Ω·cm, a resistivity reduction by 5 orders. In addition, this reduction only occurs under an oxidizing ambience. When bare ZnO is annealed under a non-oxidizing ambience, its resistivity increases. Similarly, the resistivity of ZnO when covered with a gas permeable seal of $SiO_x$ during thermal annealing also decreases under oxidizing conditions and increases under non-oxidizing conditions. In some aspects, the decrease in resistivity of ZnO when covered with a gas permeable seal and annealed under oxidizing conditions is even less than that of bare ZnO due to the inclusion of oxidizing agents in the gas permeable seal. In particular, the resistivity of ZnO when covered with $SiO_x$ with oxidizing agents under oxidizing conditions reduces from an initial amount $10^4$ Ω·cm to an amount greater than $10^2$ Ω·cm, a resistivity reduction by 2 orders. Accordingly, in an exemplary embodiment, the material of the gas permeable seal (e.g., permeable cover 210) employed with the subject MOTFTs includes oxidizing agents.

In another example, with reference to graph 302 when thermal annealing is performed on IGZO when sealed with an impermeable cover including a layers of $SiO_x/SiN_y$ or $SiO_x/Ti$ at a temperature of about 450° C. in a non-oxidizing ambiance $N_2$ or oxidizing ambience $O_2$, the initial resistivity of IGZO (e.g., the S/D regions) decreases from about $10^4$ $\Omega \cdot cm$ to less than about $10^{-2}$ $\Omega \cdot cm$, a resistivity reduction by 7 orders. This decrease in resistivity is substantially the same for both a non-oxidizing ambience of $N_2$ and an oxidizing ambience of $O_2$. Furthermore, its resistivity is decreased to an amount even lower or at least comparable to that induced by the aforementioned doping processes, such as the plasma bombardment or the ion implantation.

On the contrary, the resistivity reduction for bare IGZO (when not sealed with an impermeable cover) under oxidizing conditions is much less than that of IGZO when covered with an impermeable seal. In particular, the resistivity reduction for bare IGZO under an oxidizing ambience decreases from $10^4$ $\Omega \cdot cm$ to about $10^0$ $\Omega \cdot cm$, a resistivity reduction by 4 orders. When bare IGZO is annealed under a non-oxidizing ambience, its resistivity increases. Similarly, the resistivity of IGZO when covered with a gas permeable seal of $SiO_x$ during oxidizing thermal annealing also decreases under oxidizing conditions and increases under non-oxidizing conditions. However, the decrease in resistivity of IGZO when covered with a gas permeable seal $SiO_x$ and annealed under oxidizing conditions is even less than that of bare IGZO. In particular, the resistivity of IGZO when covered with $SiO_x$ under non-oxidizing conditions reduces from an initial amount $10^4$ $\Omega \cdot cm$ to an amount greater than $10^1$ $\Omega \cdot cm$, a resistivity reduction by 3 orders.

Figure 4:
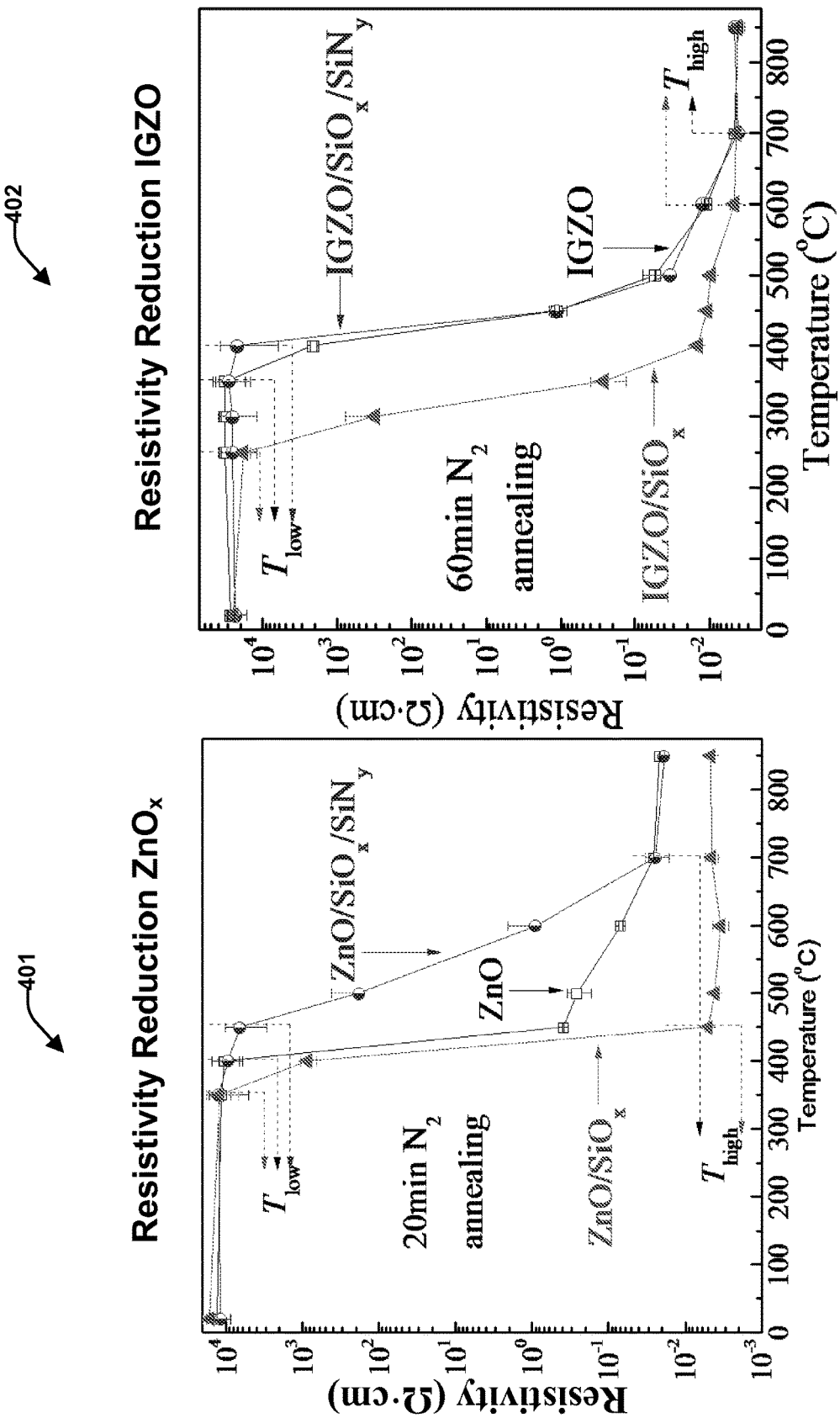

FIG. 4 provides graphs 401 and 402 demonstrating the dependence of the resistivity on the annealing temperature for ZnO and IGZO capped with different covers, in accordance with various aspects and embodiments described herein. The temperature evolutions of the resistivity of MO with different covers reveal a step-like behavior, characterized by a low and a high transition temperature ($T_{low}$ and $T_{high}$). The resistivity keeps constantly high at a temperature below $T_{low}$, starts to sharply decrease from the initial high-resistance state to a much lower value when the temperature increases from $T_{low}$ to $T_{high}$, and finally reaches the minimum saturation state at a temperature beyond $T_{high}$. Both $T_{low}$ and $T_{high}$ depend on the cover configurations and are the lower for MO sealed with a permeable cover (e.g., $SiO_x$) and an impermeable cover (e.g., $SiO_x/SiN_y$) as opposed to bare MO. Furthermore, the impermeable cover configuration results in the lowest resistivity, indicating it most efficiently turns the MO into a conductor with the smallest resistivity and the lowest transition temperature.

Figure 5:
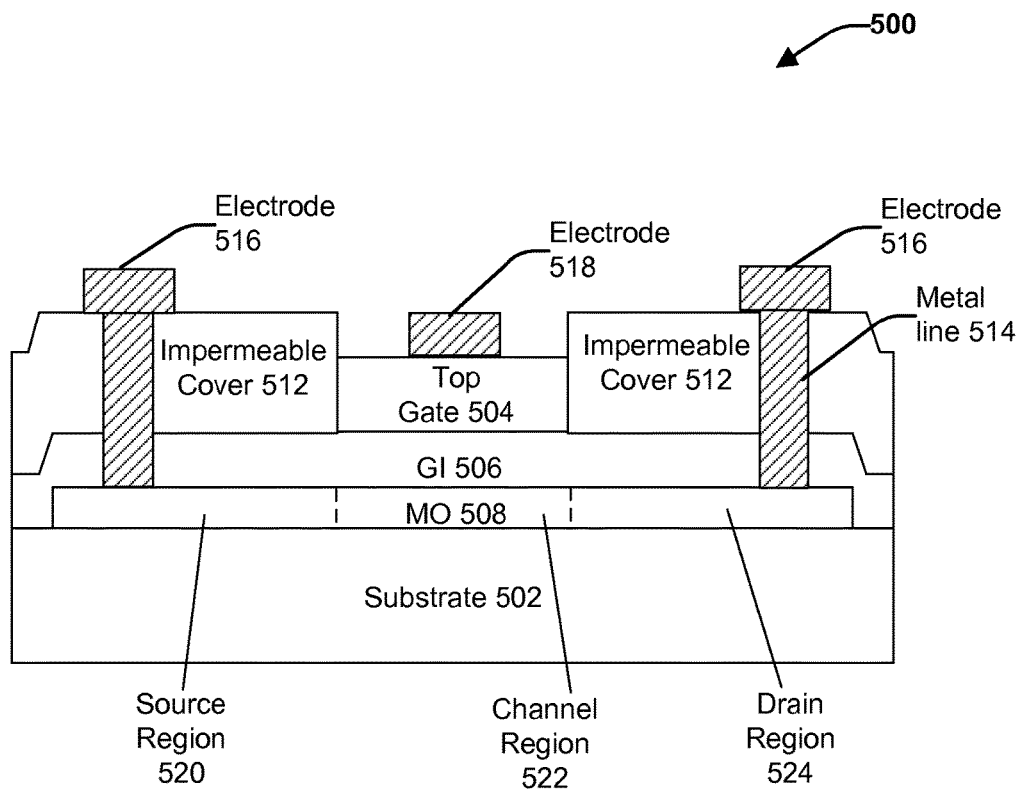
FIG. 5 presents a cross-sectional view of an example top gate MOTFT device having source and drain regions capped with gas impermeable covers in accordance with aspects and embodiments described herein.

FIG. 5 presents a cross-sectional view of a example top gate MOTFT device 500 having source and drain regions capped with gas impermeable covers in accordance with aspects and embodiments described herein. MOTFT device 500 includes same or similar features as MOTFT device 200. Repetitive description of like elements employed in respective embodiments of MOTFT devices described herein is omitted for sake of brevity.

MOTFT Device 500 includes a substrate 502 having an active MO layer 508 provided thereon. A gate stack consisting of a gate insulating (GI) layer 506 and a top gate 504 is formed over the active MO layer 508. Like device 200, the source and drain regions (e.g., source region 520 and drain region 524) are respectively covered by impermeable covers 512. The GI layer 506 is sandwiched between the impermeable covers 512 and the S/D regions. In an aspect, the portion of the GI layer 506 formed over the channel region serves the function of permeable cover 210. Device 500 further includes source and drain electrodes 516 respectively connected to the source and drain regions 520 and 524 respectively, via metal lines 514, thus establishing ohmic S/D contacts. Another electrode 518 is further connected to the top gate 504. In an aspect, electrodes 516 and 518 respectively include a metal (e.g., aluminum).

In an aspect, the materials, dimensions and properties (e.g., resistivity) of like elements included in MOTFT device 200 and MOTFT device 500 are the same or substantially the same. In particular, substrate 502 can include same materials, properties and dimensions as substrate 202. Active MO layer 508 can include same materials, properties and dimensions as MO Active layer 208. Gate insulator layer 506 can include same materials, properties and dimensions as GI 206. Impermeable covers 512 can include same materials, properties and dimensions as impermeable covers 212 and top gate 504 can include same materials, properties and dimensions as bottom gate 204.

Further, like MOTFT device 200, in an exemplary embodiment, MOTFT device 500 has been subjected to thermal annealing under one or more of the conditions described herein. In particular, MOTFT device 500 has been annealed under an oxidizing ambience or a non-oxidizing ambience at the respective temperatures and for the respective durations described herein, while the source 520 and drain 524 regions were protected by impermeable covers 512 and while the channel region 522 was left exposed or protected by the gate stack (consisting of the top gate electrode and the GI layer). Therefore, the resistivity of the source and drain regions is low (e.g., less than $10^0$ $\Omega \cdot cm$, less than $10^{-1}$ $\Omega \cdot cm$ or even less than $10^{-2}$ $\Omega \cdot cm$) while the resistivity of the channel region 522 is high (e.g., greater than $10^0$ $\Omega \cdot cm$, greater than $10^1$ $\Omega \cdot cm$, greater than $10^2$ $\Omega \cdot cm$, greater than $10^3$ $\Omega \cdot cm$ or even greater than $10^4$ $\Omega \cdot cm$)), despite the active MO layer 508 being undoped or having a low doping concentration.

Unlike bottom-gate MOTFT 200, the channel 222 of top-gate MOTFT 500 is covered by the gate stack of the GI layer 506 and the top gate electrode 504. Thus in an aspect, materials permeable to oxygen are chosen to form the gate stack. However, not all gate insulators can meet this requirement. For example, the common GI material of $SiN_y$ will decrease the resistivity of not only the S/D regions but also the channel during performance of an oxidizing heat-treatment and electrically short the S/D regions through the resulting conductivity of the channel. Thus in exemplary embodiment, the GI layer 506 of MOTFT device 500 includes $SiO_x$ (e.g., one suitable choice of a permeable GI). Similarly, a permeable top gate electrode 504 is needed (unlike an impermeable metal which can be used for the bottom gate electrode 204 of device 200). Another concern of the gate electrode is that it should not lose its conductivity during an oxidizing anneal, since most metals can be thermally oxidized and their conductivity accordingly decreases. Thus in an exemplary embodiment, the top-gate 504 of MOTFT device 500 includes an MO conductor, such as indium-tin oxide (ITO).

Figure 6A:
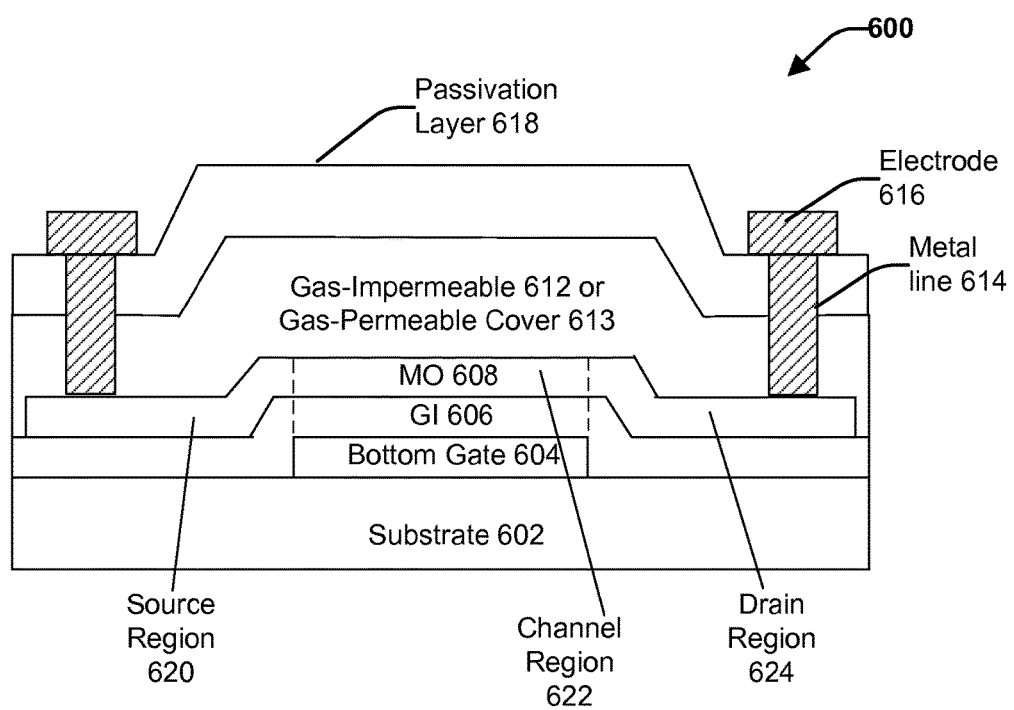
FIGS. 6A-6C present cross-sectional views of example bottom gate junctionless MOTFT devices in accordance with aspects and embodiments described herein.
Figure 6B:
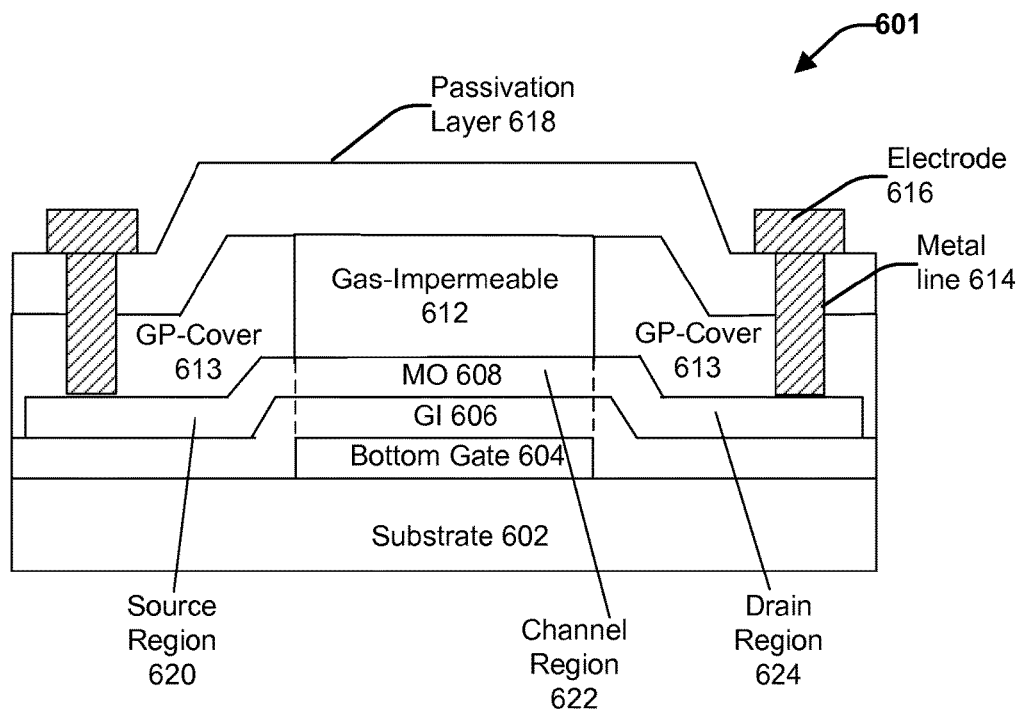
Figure 6C:
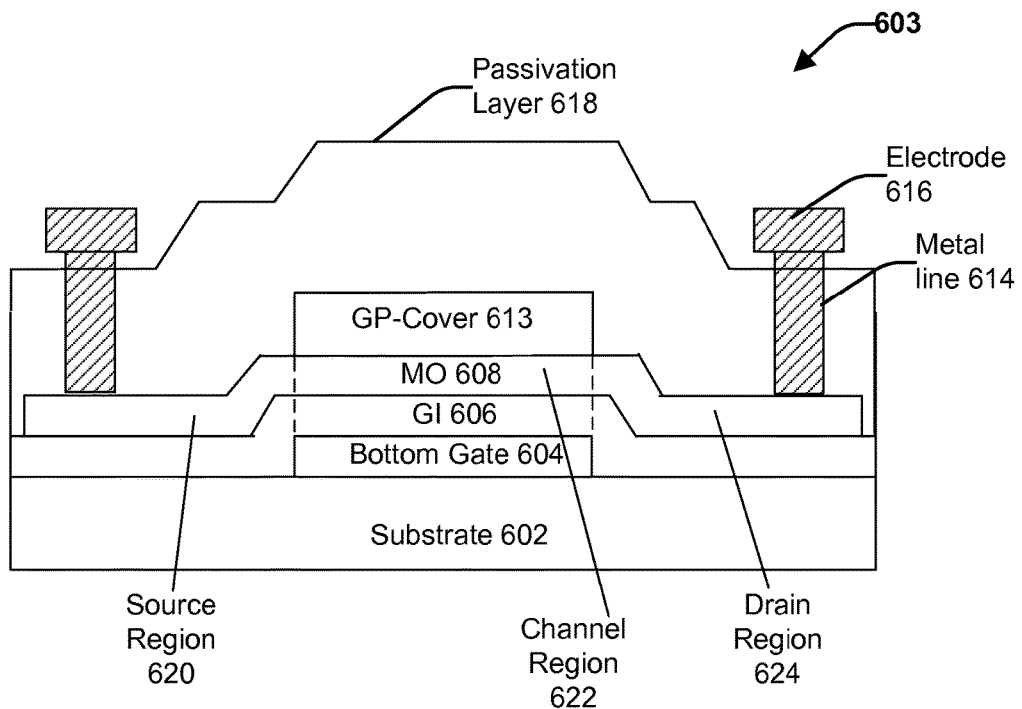

FIGS. 6A-6C present cross-sectional views of example bottom gate junctionless MOTFT devices 600, 601 and 603, respectively, having the S/D and/or the channel regions capped with a gas-impermeable or gas-permeable cover in accordance with aspects and embodiments described herein. MOTFT devices 600, 601 and 603 can include same or similar features as MOTFT device 200. Repetitive description of like elements employed in respective embodiments of MOTFT devices described herein is omitted for sake of brevity.

A junctionless transistor (JLT) is a FET with no PN nor N+N or P+P junctions. The device is essentially a resistor in which the mobile carrier density in the channel region can be modulated by the gate. In the on state there is a large body current due to the relatively high carrier concentration in the channel region, to which surface accumulation current can be added. In the off state the channel is turned off by the gate voltage due to the depletion of carriers in the channel region and the accordingly increased channel p. By using the subject MO annealing and sealing techniques, a TFT can be formed having an active area with a suitable resistivity modulation to form a junctionless transistor, such as junctionless transistor 600.

With reference to FIG. 6A, similar to MOTFT device 200, MOTFT device 600 includes a substrate 602 having a gate stack formed thereon consisting of a bottom gate 604 formed on the substrate 602, a gate insulating (GI) layer 606 formed on the bottom gate 604. A MO layer 608 is formed over the gate stack, coving the GI layer 606. In an aspect, the entire MO active layer 608, including the S/D regions (source regions 620 and drain region 624) and the channel region 622, is covered by a gas-impermeable cover 612. In another aspect, the entire MO active layer 608 is covered by a gas permeable cover 613. Still in yet another aspect, (not shown), the MO active layer 608 is left bare (not covered with a gas-impermeable 612 or gas-permeable cover 613). Device 600 further includes source and drain electrodes 616 respectively connected to the source and drain regions 620 and 624 respectively, via metal lines 614, thus establishing ohmic S/D contacts.

In an aspect, the materials, dimensions and properties (e.g., resistivity) of like elements included in MOTFT device 600 and MOTFT device 200 are the same or substantially the same. In particular, substrate 602 can include same materials, properties and dimensions as substrate 202. Active MO layer 608 can include same materials, properties and dimensions as MO active layer 208. Gate insulator layer 606 can include same materials, properties and dimensions as GI 206. The gas-impermeable 612 or gas permeable cover 613 can include same materials, properties and dimensions as gas-impermeable cover 212 and gas permeable cover 210, respectively, and bottom gate 604 can include same materials, properties and dimensions as bottom gate 204.

In an exemplary embodiment, MOTFT device 600 has been subjected to thermal annealing under one or more of the conditions described herein to control the resistivity of the entire active area. In an aspect, MOTFT device 600 has been annealed under a non-oxidizing ambience at the respective non-oxidizing ambience temperatures and for the respective durations described herein, while the entire active region (e.g., the S/D and channel regions) was covered with either a gas-impermeable or gas permeable cover. In an aspect, when covered with a gas-impermeable cover 612 and annealed under a non-oxidizing ambience, the resistivity of the MO active layer is lowered to less than $10^0$ Ω·cm, less than $10^{-1}$ Ω·cm or even less than $10^{-2}$ Ω·cm. When covered with a gas-permeable cover 613 and annealed under a non-oxidizing ambience, the resistivity of the MO active layer is lowered to less than $10^0$ Ω·cm, less than $10^{-1}$ Ω·cm or even less than $10^{-2}$ Ω·cm.

In another aspect, device 600 has been annealed under an oxidizing ambience at the respective oxidizing ambience temperatures and for the respective durations described herein, while the entire active region (e.g., the S/D and channel regions) was covered with a gas-impermeable cover 612. When covered with a gas-impermeable cover 612 and annealed under an oxidizing ambience, the resistivity of the MO active layer is lowered to less than $10^0$ Ω·cm, less than $10^{-1}$ Ω·cm or even less than $10^{-2}$ Ω·cm. Still in yet another aspect, (not shown) device 600 has been annealed under a non-oxidizing ambience at the respective non-oxidizing ambience temperatures and for the respective durations described herein, while the entire active region (e.g., the S/D and channel regions) was left exposed (e.g., not covered with either a gas-impermeable cover). In this scenario, the resistivity of the MO active layer is lowered to approximately less than $10^0$ Ω·cm, less than $10^{-1}$ Ω·cm or even less than $10^{-2}$ Ω·cm.

FIG. 6B presents an example of a bottom gate junctionless MOTFT device 601 with a portion of the active layer covered with a gas-permeable cover in accordance with additional aspects and embodiments described herein. Device 601 includes same or similar structures, features and functionality as device 600. Repetitive description of like features employed in other embodiments is omitted for sake of brevity.

Device 601 differs from device 600 with respect to the resistivity of the respective channel region 622 and S/D regions 620/624 of the annealed MO active layer 608 due to a different cover configuration and annealing condition combination. In particular, rather than being covered entirely with a gas-impermeable 612 or gas-permeable 613 cover or entirely uncovered, only the S/D regions 620/624 of the MO active layer are covered with a gas-permeable cover 613.

In an exemplary embodiment, MOTFT device 601 has been subjected to thermal annealing under a non-oxidizing ambience at the respective non-oxidizing ambience temperatures and for the respective durations described herein, while the S/D regions 620/624 were covered with the gas-permeable cover and the channel region 622 was covered with the gas-impermeable cover. According to this embodiment, the resulting resistivity of the S/D regions 620/624 is different from the resulting resistivity of the channel region 622. In particular, the resistivity of the S/D regions 620/624 can be different from the resistivity of the channel region 622. In an aspect, the resistivity of the S/D regions 620/624 of device 601 as a result of annealing in a non-oxidizing ambience with the permeable cover 613 thereon is less than $10^0$ Ω·cm, less than $10^{-1}$ Ω·cm or even less than $10^{-2}$ Ω·cm. In addition, an aspect, the resistivity of the channel region 622 of device 601 as a result of annealing in the non-oxidizing ambience while being exposed is less than $10^0$ Ω·cm, less than $10^{-1}$ Ω·cm or even less than $10^{-2}$ Ω·cm. In another embodiment, the S/D regions 620/624 were covered with the gas-permeable cover, while the channel region 622 was left exposed (not shown). Yet in another embodiment, the channel region 622 was covered with the gas-permeable cover (not shown), while the S/D regions 620/624 were covered with the gas-impermeable cover or left exposed.

FIG. 6C presents an example bottom gate junctionless MOTFT device 603 with a portion of the active layer exposed in accordance with additional aspects and embodiments described herein. Device 603 includes same or similar structures, features and functionality as device 600. Repetitive description of like features employed in other embodiments is omitted for sake of brevity.

Device 603 differs from device 600 with respect to the resistivity of the respective channel region 622 and S/D regions 620/624 of the annealed MO active layer 608 due to a different cover configuration and annealing condition combination. In particular, rather than being covered entirely with a gas-impermeable 612 or gas-permeable 613 cover or entirely uncovered, only the S/D regions 620/624 of the MO active layer are left exposed.

In an exemplary embodiment, MOTFT device 603 has been subjected to thermal annealing under a non-oxidizing ambience at the respective non-oxidizing ambience temperatures and for the respective durations described herein, while the S/D regions 620/624 were exposed and the channel region 622 was covered with the gas-permeable cover 613. According to this embodiment, the resulting resistivity of the S/D regions 620/624 is different from the resulting resistivity of the channel region 622. In particular, the resistivity of the S/D regions 620/624 is higher than the resistivity of the channel region 622. In an aspect, the resistivity of the S/D regions 620/624 of device 601 as a result of annealing in a non-oxidizing ambience with the permeable cover 613 thereon is less than $10^0$ Ω·cm, less than $10^{-1}$ Ω·cm or even less than $10^{-2}$ Ω·cm. In addition, an aspect, the resistivity of the channel region 622 of device 601 as a result of annealing in the non-oxidizing ambience while being exposed is less than $10^0$ Ω·cm, less than $10^{-1}$ Ω·cm or even less than $10^{-2}$ Ω·cm. In another embodiment, the S/D regions 620/624 were left exposed, while the channel region 622 was covered with the gas-impermeable cover (not shown). Yet in another embodiment, the channel region 622 was left exposed (not shown), while the S/D regions 620/624 were covered with the gas-impermeable cover or the gas-permeable cover.

Figure 7:
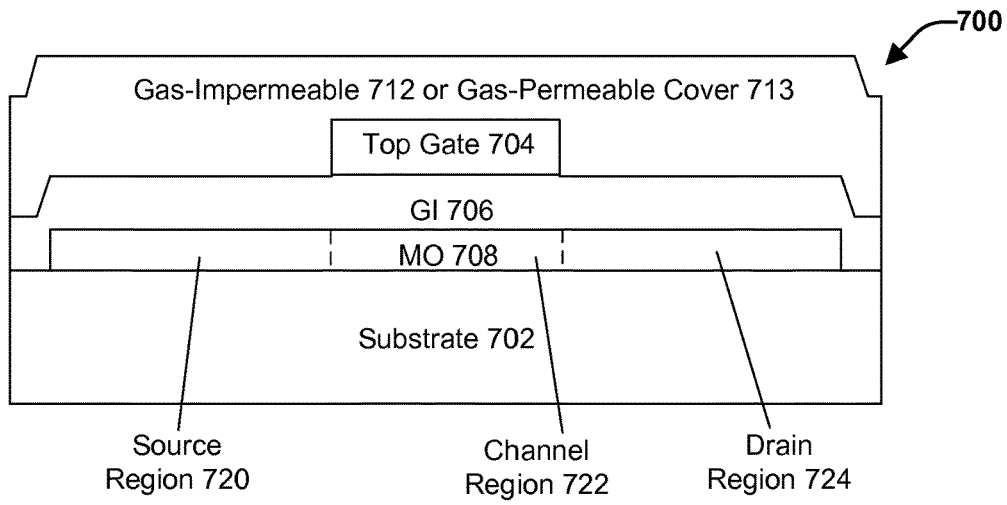
FIGS. 7-9 present cross-sectional views of example top gate junctionless MOTFT device in accordance with aspects and embodiments described herein.
Figure 8:
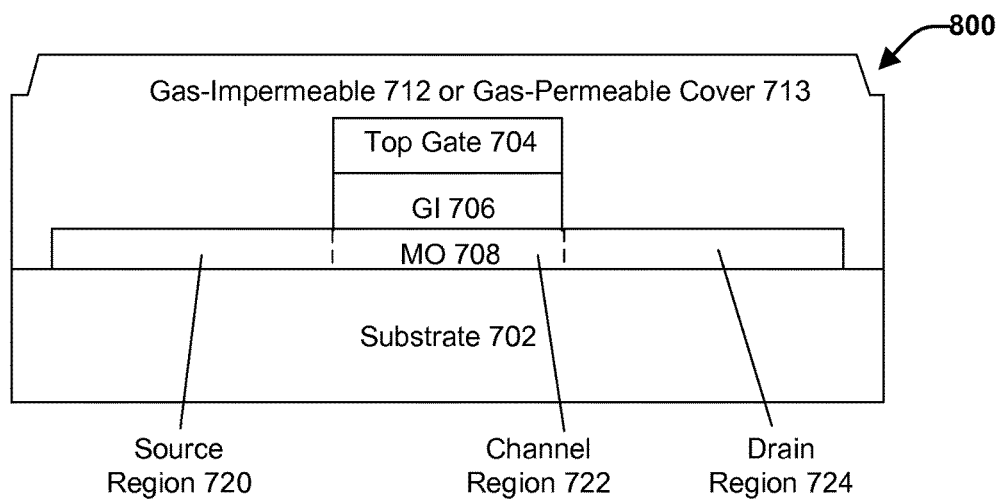
Figure 9:
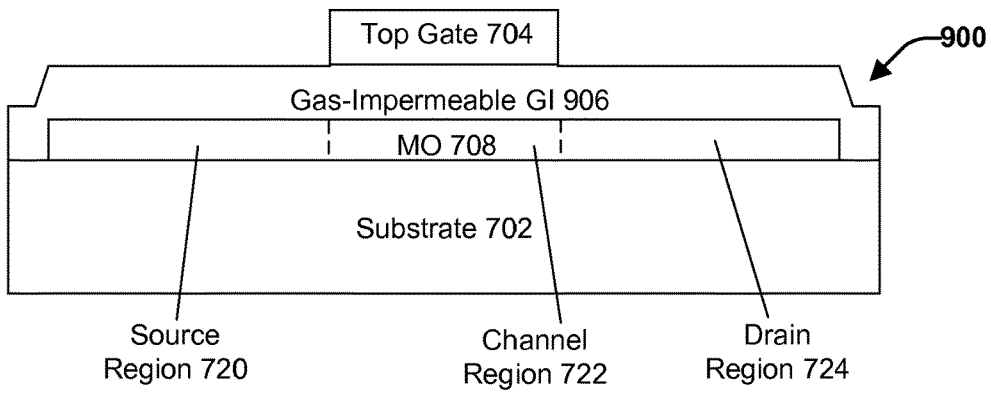

FIGS. 7-9 present cross-sectional views of example top gate junctionless MOTFT devices 700-900, respectively, having the S/D and channel regions capped with a gas-impermeable or gas-permeable cover in accordance with aspects and embodiments described herein. MOTFT devices 700 can include same or similar features as MOTFT device 500. The gate electrodes and metal lines are not shown for the devices of FIGS. 7-9 merely for ease of explanation. It should be appreciated that the gate electrodes and metal lines of the respective junctionless MOTFT devices 700-900 can be added using the disclosed and conventional fabrication techniques and materials. Repetitive description of like elements employed in respective embodiments of MOTFT devices described herein is omitted for sake of brevity.

Similar to MOTFT device 500, MOTFT devices 700-900 includes a substrate 702 having a MO active layer 708 formed thereon and a gate stack formed over the MO active layer 708 consisting of an insulating (GI) layer 706 (or impermeable GI layer 906 for device 900) formed on the MO active layer 708 and a top gate 704 formed on the GI layer. In an aspect, the GI layer covers the entire upper surface of the MO active layer 708, as shown for devices 700 and 900. In another aspect, the GI layer over the S/D regions is etched prior to deposition of a gas-impermeable or gas permeable cover thereon such that the GI layer is formed only over a portion of the MO active layer 708 formed directly under the top gate 704, as shown for device 800. In an aspect, the gate stack and the MO active layer 708 is covered with a gas-impermeable or gas-permeable seal, as shown for devices 700 and 800. In another aspect, rather than employing a gas-impermeable seal, the GI layer 906 is formed with a gas-impermeable material (including those described herein) and formed over the entire surface of the MO active layer, as shown for device 900. In another aspect, the GI layers over the S/D regions 720/724 are etched and the S/D regions 720/724 are left exposed (not shown).

In an aspect, the materials, dimensions and properties (e.g., resistivity) of like elements included in MOTFT devices 200 and 500 and MOTFT devices 700-900 are the same or substantially the same. In particular, substrate 702 can include same materials, properties and dimensions as substrate 502. Active MO layer 708 can include same materials, properties and dimensions as MO active layer 508. Gate insulator layer 706 can include same materials, properties and dimensions as GI 506. The gas-impermeable cover 712 and the gas permeable cover 713 can include same materials, properties and dimensions as gas-impermeable cover 212 and gas permeable cover 210, respectively, and the top gate 704 can include same materials, properties and dimensions as top gate 504.

In an exemplary embodiment, MOTFT devices 700-900 have been subjected to thermal annealing under one or more of the conditions described herein to control the resistivity of the entire active area. In an aspect, MOTFTs device 700 and 800 have been annealed under a non-oxidizing ambience at the respective non-oxidizing ambience temperatures and for the respective durations described herein, while the entire active region (e.g., the S/D and channel regions) was covered with either a gas-impermeable cover 712 or gas permeable cover 713. When covered with a gas-impermeable cover 712 and annealed under a non-oxidizing ambience, the resistivity of the MO active layer 708 of device 700 is lowered to less than $10^0$ Ω·cm, less than $10^{-1}$ Ω·cm or even less than $10^{-2}$ Ω·cm. When covered with a gas-impermeable cover 712 and annealed under a non-oxidizing ambience, the resistivity of the MO active layer 708 of device 800 is lowered to less than $10^0$ Ω·cm, less than $10^{-1}$ Ω·cm or even less than $10^{-2}$ Ω·cm. When covered with a gas permeable cover 713 and annealed under a non-oxidizing ambience, the resistivity of the MO active layer 708 of device 700 is lowered to less than $10^0$ Ω·cm, less than $10^{-1}$ Ω·cm or even less than $10^{-2}$ Ω·cm. When covered with a gas-permeable cover 713 and annealed under a non-oxidizing ambience, the resistivity of the MO active layer 708 of device 800 is lowered to less than $10^0$ Ω·cm, less than $10^{-1}$ Ω·cm or even less than $10^{-2}$ Ω·cm. Still in yet another aspect, (not shown) devices 700 and 800 have been annealed under a non-oxidizing ambience at the respective non-oxidizing ambience temperatures and for the respective durations described herein, while neither a gas-impermeable cover 712 or gas-permeable cover 713 was used and the top gate 704 and GI 706 were deposited or not. In this scenario, the resistivity of the MO active layer is lowered to approximately less than $10^0$ Ω·cm, less than $10^{-1}$ Ω·cm or even less than $10^{-2}$ Ω·cm.

In another aspect, devices 700-900 have been annealed under an oxidizing ambience at the respective oxidizing ambience temperatures and for the respective durations described herein, while the entire active region (e.g., the S/D and channel regions) was covered with a gas-impermeable cover 712 or impermeable gate insulator 906 (e.g., as shown for device 900). When covered with a gas-impermeable cover 712 and annealed under an oxidizing ambience, the resistivity of the MO active layer is lowered to less than $10^0$ Ω·cm, less than $10^{-1}$ Ω·cm or even less than $10^{-2}$ Ω·cm.

FIGS. 10-14 depict an example process for fabricating a bottom gate MOTFT device (e.g., MOTFT device 200) having source and drain regions capped with gas impermeable covers in accordance with aspects and embodiments described herein. Repetitive description of like elements employed in respective embodiments of MOTFT devices and techniques for fabricating the MOTFT device described herein is omitted for sake of brevity.

Figure 10:
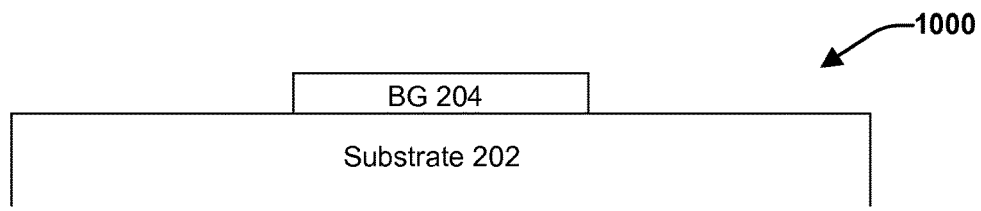
FIGS. 10-16 depict an example process for fabricating a bottom gate MOTFT device having source and drain regions capped with gas impermeable covers in accordance with aspects and embodiments described herein.
Figure 11:
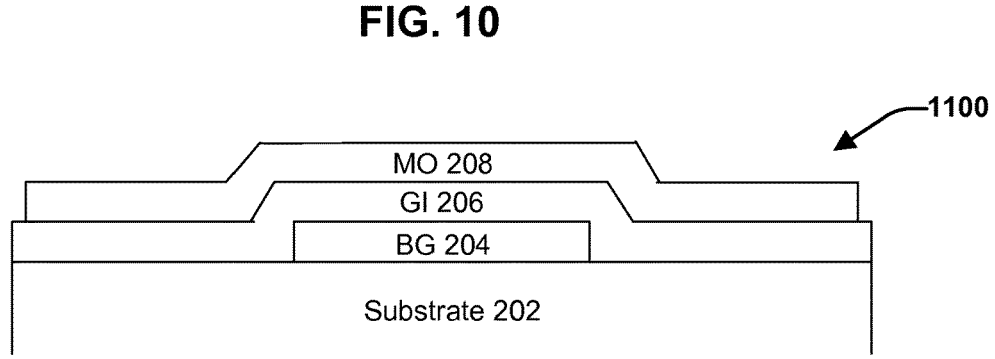
Figure 12:
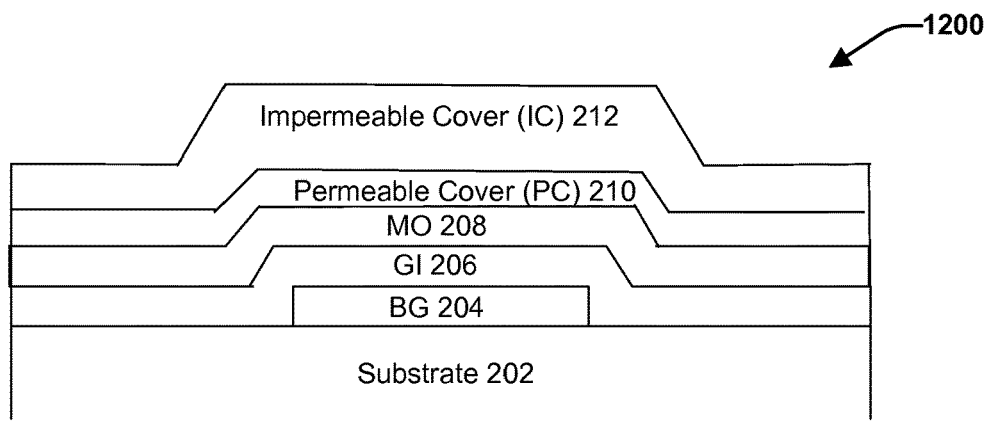
Figure 13:
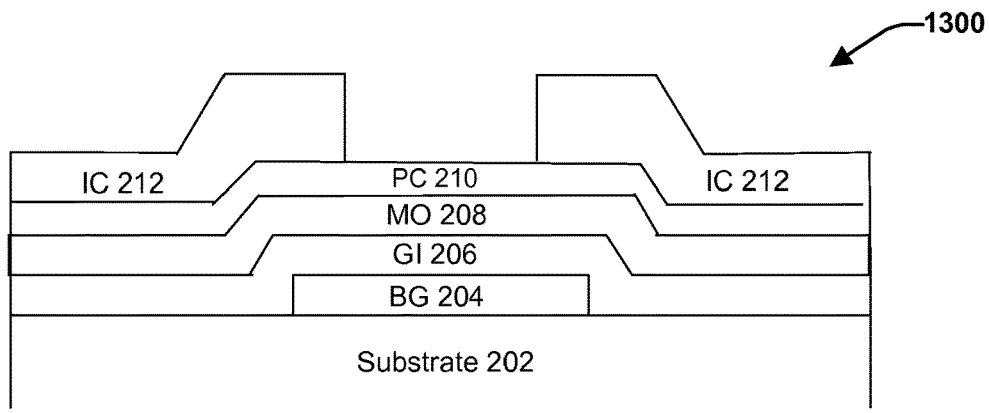

FIG. 10 depicts an intermediate transistor structure 1000 following deposition of the bottom electrode 204 onto the substrate 202 and patterning of the bottom gate (BG) electrode 204. FIG. 11 depicts an intermediate transistor structure 1100 resulting from deposition of the GI layer 206 over the BG 204 and subsequent deposition of the active MO layer 208 over the GI layer 206. Thereafter, as depicted in FIG. 12, a double layer consisting of a permeable cover (PC) or layer (e.g., $SiO_x$) and an impermeable cover (IC) 212 or layer (e.g., $SiN_y$) is deposited (e.g., via plasma-enhanced chemical vapor deposition (PECVD) over the active MO layer 208. The impermeable cover 212 is then patterned as shown in FIG. 13 using a suitable etching technique so that portions of the impermeable cover 212 are located only over and adjacent to outer regions/portion of the active MO layer 208 corresponding to the S/D regions of the active MO layer 208 to form intermediate transistor structure 1300. In an aspect, the permeable cover 210 protects the channel region from possible damage during patterning of the impermeable cover 212. As a result, the etch-stop layer 110 used when forming the S/D regions in the conventional bottom-gate MOTFTs (e.g., device 100) is not needed, resulting in a decreased fabrication cost. According to this aspect, the etchant employed to etch the impermeable layer 212 has a high etch selectivity for the impermeable layer over the permeable layer.

Structure 1300 is then subjected to thermal annealing, in accordance with the ambience and temperature conditions described herein, with middle portion of the active MO layer 208 corresponding to the channel region being covered only with the permeable layer 210. In addition to protecting the channel region during etching of the impermeable layer 212, the permeable layer 210 facilitates improvement of the channel quality during the annealing process by minimizing a decrease in channel resistivity associated with the annealing, and in some cases increasing channel resistivity during the annealing process. In one example, structure 1300 is annealed in an oxidizing ambience at a temperature greater than 100° C. for a duration between 10 seconds and 10 hours. In another example, structure 1300 is annealed in an oxidizing ambience at a temperature greater than or equal to 500° C. for a duration between 20 minutes and 1 hour. In another example, structure 1300 is annealed in a non-oxidizing ambience at a temperature between 100° C. and 700° C. for a duration between 10 seconds and 10 hours. Still in yet another example, structure 1300 is annealed in a non-oxidizing ambience at a temperature less than 500° C. for a duration between 20 seconds and 1 hour. The thermal annealing not only forms the highly conductive S/D regions but also improve the channel quality by annihilating the native defects.

In another aspect, although not shown, deposition and inclusion of the permeable cover 210 is skipped. According to this aspect, the impermeable cover 212 is etched to expose the middle surface of the active MO layer 208. Annealing is then performed with the channel region exposed. Yet in another aspect, although not shown, the impermeable cover 212 and the permeable cover 210 over the channel region are both etched to expose the middle surface of the active MO layer 208. Annealing is then performed with the channel region exposed.

Figure 14:
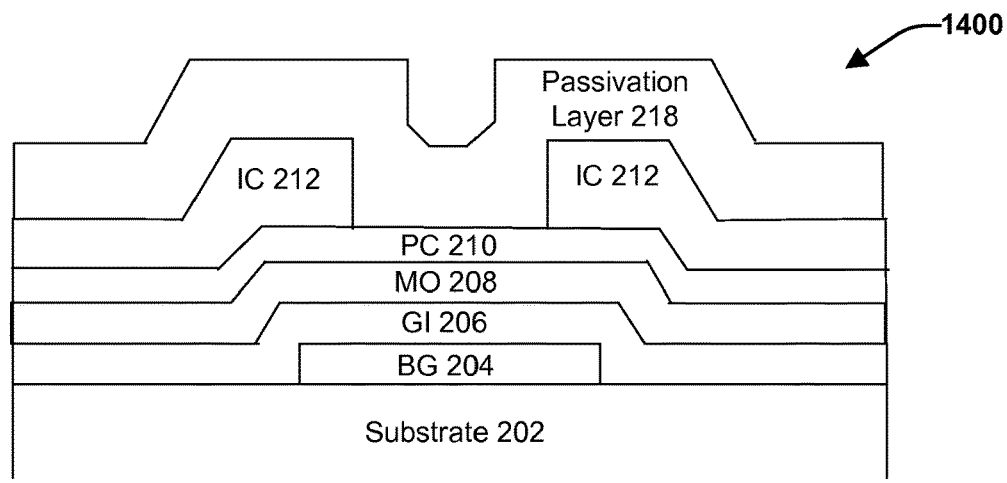
Figure 15:
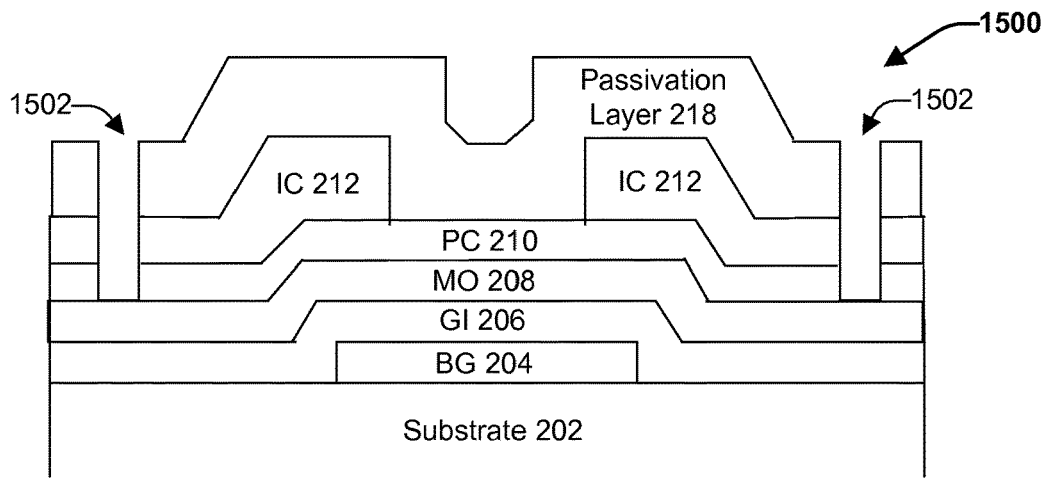
Figure 16:
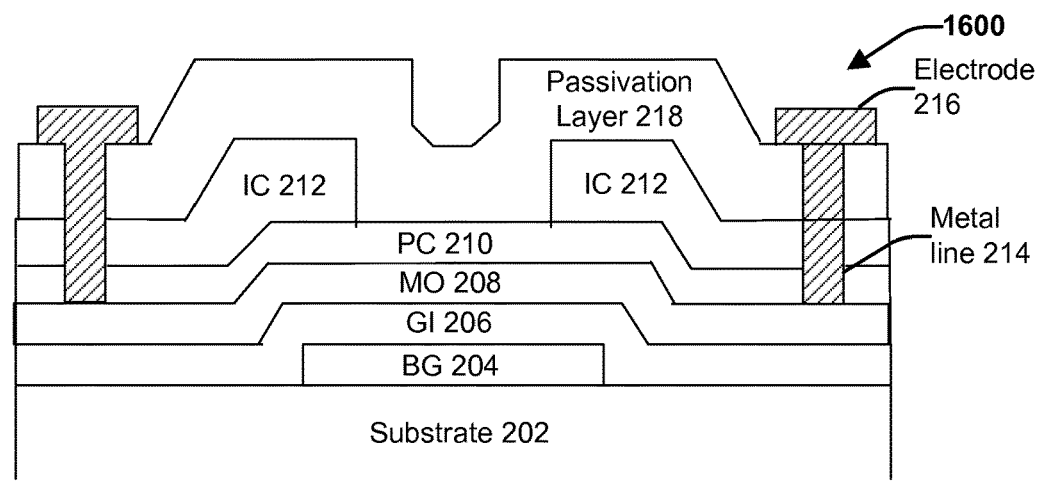

After annealing is complete, the passivation layer 218 is deposited over the impermeable covers 212 and the channel region (e.g., either exposed or covered with permeable cover 210). The resulting intermediate transistor structure is depicted in FIG. 14. Thereafter, as shown in FIG. 15, contact holes/openings 1502 are formed through the passivation layer 218, the impermeable covers 212, the permeable cover 210 and the gate insulator 206 to the source and drain regions of the active MO layer 208 and the bottom gate electrode 204 (not shown) to establish intermediate structure 1500. Processing is then finalized to form the bottom gate MOTFT structure 1600 shown in FIG. 16 via deposition of electrodes 216 and metal lines 214. In an aspect, MOTFT structure 1600 corresponds to MOTFT device 200.

FIGS. 17-22 depict an example process for fabricating a bottom gate MOTFT device (e.g., MOTFT device 200) having self-aligned source and drain regions capped with gas impermeable covers in accordance with aspects and embodiments described herein. In particular, FIGS. 17-22 depict a process for forming a bottom gate MOTFT device with self-aligned S/D regions using a backside exposure technique. In accordance with the backside exposure technique, the MOTFT device is formed using a transparent substrate (e.g., glass) and the bottom gate (BG) is formed with a non-transparent material. Photolithography then performed after deposition of the impermeable cover 212. Repetitive description of like elements employed in respective embodiments of MOTFT devices and techniques for fabricating the MOTFT device described herein is omitted for sake of brevity.

Figure 17:
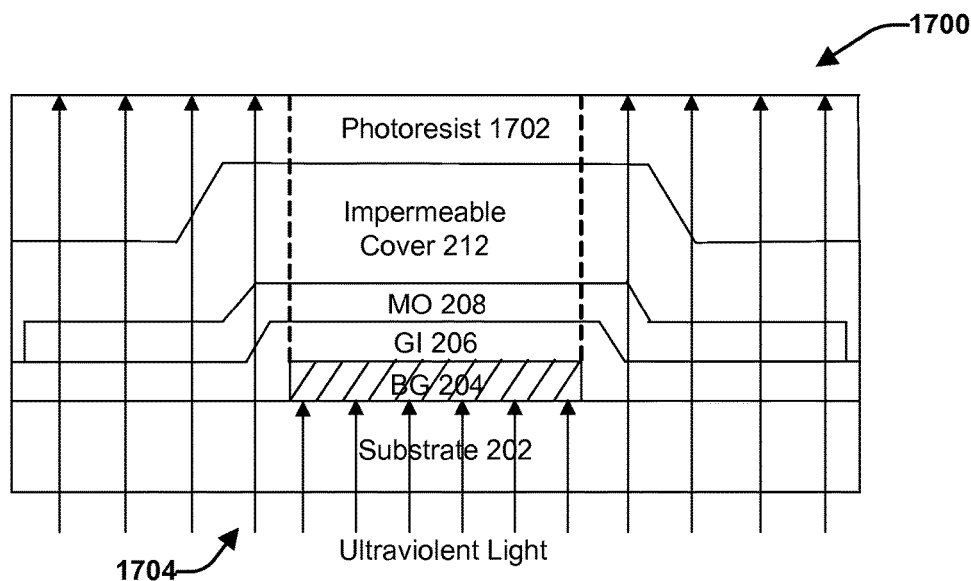
FIGS. 17-22 depict another example process for fabricating a bottom gate MOTFT device having source and drain regions capped with gas impermeable covers in accordance with aspects and embodiments described herein.
Figure 18:
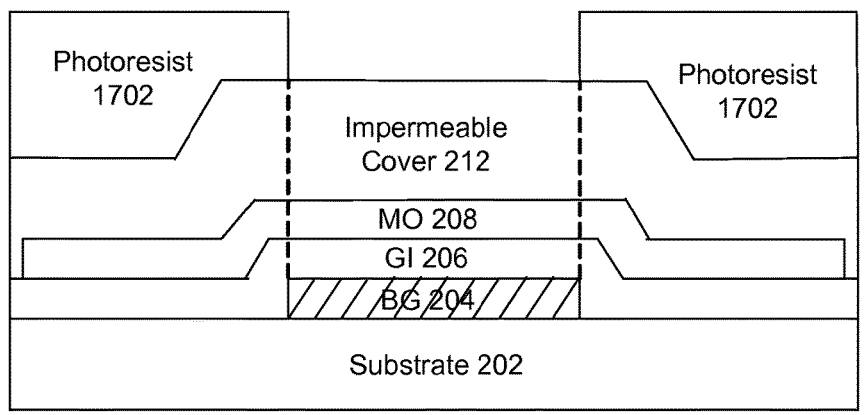

FIG. 17 depicts an intermediate transistor structure 1700 including non-transparent BG 204 formed on a transparent substrate 202. The structure 1700 further includes the GI layer 206 deposited over the BG 204 and the substrate, the active MO layer 208 formed over and adjacent to the GI layer 206, the impermeable cover 212 formed over and adjacent to the active MO layer 212 and a photoresist 1702 formed over and adjacent to the impermeable cover 212. Structure 1700 is subjected to photolithography via shining of ultraviolent light toward the backside 1704 of the substrate towards the photoresist 1702 (as indicated by the direction of the arrows). The portion of the photoresist 1702 above the BG 204 (e.g. between the dashed lines) is protected from exposure by the backside ultraviolet light. When the photoresist is negative or an image reversal photoresist, exposed portions of the photoresist (e.g., outside of the dashed lines corresponding to the S/D regions) will remain after its development, as shown by structure 1800 of FIG. 18.

Figure 19:
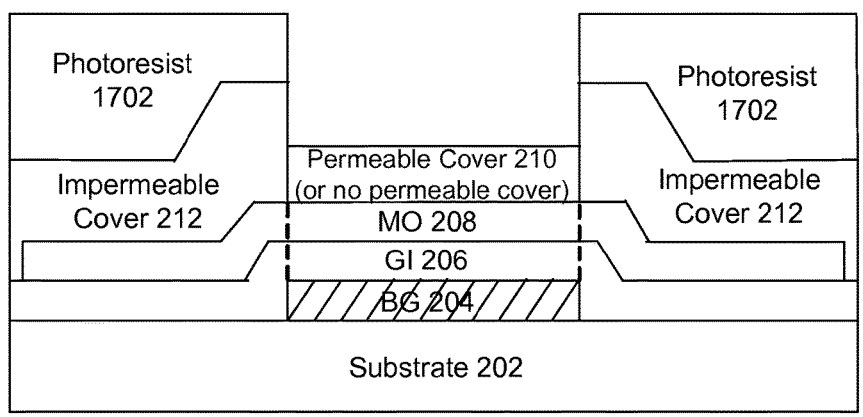
Figure 20:
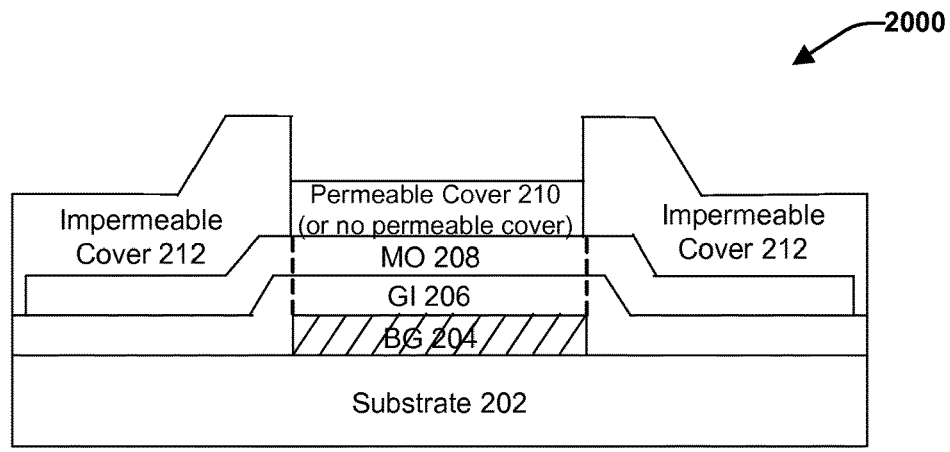

After photolithography is performed, the portion of the impermeable cover 212 over the channel region is subsequently etched to form structure 1900 of FIG. 19. As seen in FIG. 19, the remaining portions of the impermeable cover 212 are self-aligned to the BG 204, as indicated by the dashed lines of structure 1900. Thereafter, the channel region can be left exposed or covered with the permeable cover 210. FIG. 20 depicts an intermediate transistor structure 2000 after removal of the photoresist from structure 1900. Thermal annealing is then performed on structure 2000 in accordance with aspects and embodiments described herein.

Figure 21:
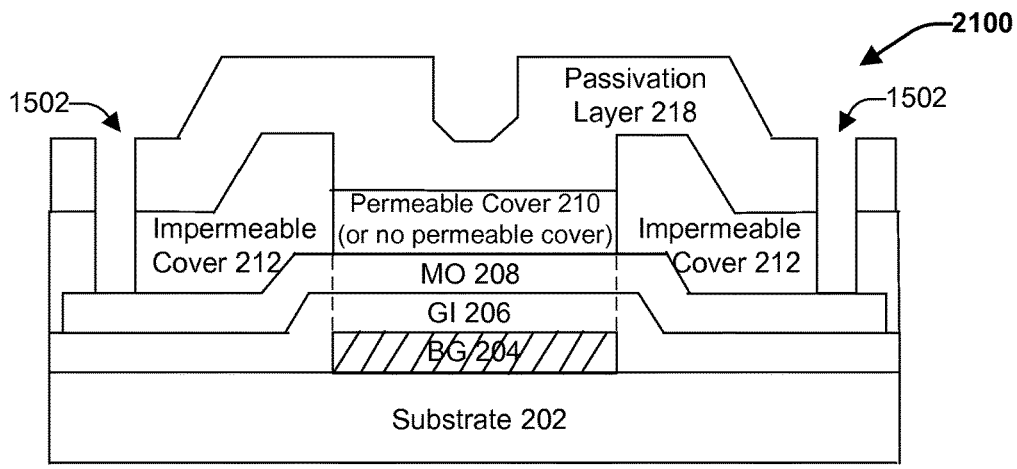
Figure 22:
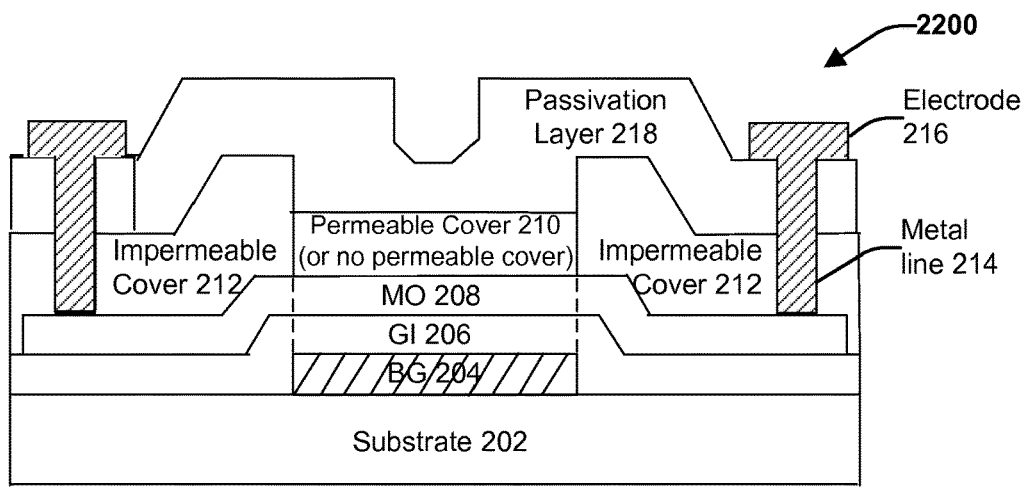

After annealing is complete, as shown in FIG. 21, the passivation layer 218 is deposited over the impermeable covers 212 and the channel region (e.g., either exposed or covered with permeable cover 210) and contact holes/openings 1502 are formed through the passivation layer 218 and the impermeable covers 212, the permeable cover 210 and the gate insulator 206 to the source and drain regions and the bottom gate electrode 204 (not shown) of the active MO layer 208 to establish intermediate structure 2100. Processing is then finalized to form the bottom gate MOTFT structure 2200 shown in FIG. 22 via deposition of electrodes 216 and metal lines 214. In an aspect, MOTFT structure 2200 corresponds to MOTFT device 200.

FIGS. 23-26 depict an example process for fabricating a top gate MOTFT device (e.g., MOTFT device 500) having source and drain regions capped with gas impermeable covers in accordance with aspects and embodiments described herein. Repetitive description of like elements employed in respective embodiments of MOTFT devices and techniques for fabricating the MOTFT device described herein is omitted for sake of brevity.

Figure 23:
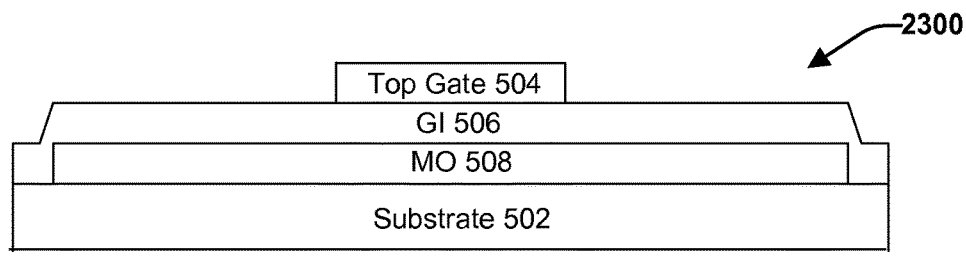
FIGS. 23-26 depict an example process for fabricating a top gate MOTFT device having source and drain regions capped with gas impermeable covers in accordance with aspects and embodiments described herein.
Figure 24:
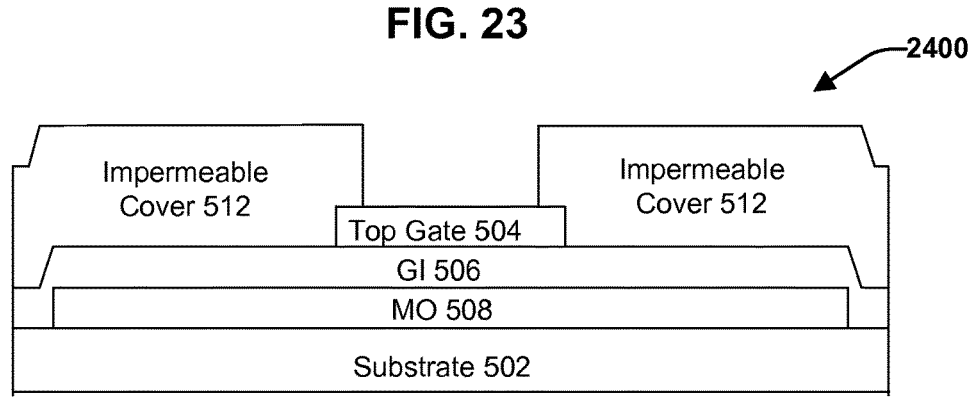

FIG. 23 depicts an intermediate transistor structure 2300 following deposition of the active MO layer 508 onto the substrate 502, then deposition of the GI layer 506 and deposition and patterning of the top gate 504. In an exemplary embodiment, the substrate includes a thermally oxidized silicon wafer, the active MO layer includes ZnO or IGZO, the GI layer includes a gas permeable material (e.g., $SiO_x$), and the top gate 504 includes a gas permeable material (e.g., ITO). Thereafter, the impermeable cover 512 is deposited over the GI layer 506 and possibly a portion of the top gate 504 and patterned so that portions of the impermeable cover 512 are located only over outer regions/portions of the GI layer 506 and the active MO layer 508 corresponding to the S/D regions of the active MO layer 508. The resulting intermediate transistor structure 2400 is depicted in FIG. 24. As seen in structure 2400, a middle portion of the active MO layer 508 located under the top gate 504 and corresponding to the channel region is left exposed. In other words, at least a portion of the top gate 504 is not covered with the impermeable cover 512. In an aspect, the impermeable cover 512 is deposited via plasma-enhanced chemical vapor deposition (PECVD).

In an aspect, structure 2400 is then subjected to thermal annealing in accordance with the ambience and temperature conditions described herein. In one example, structure 2400 is annealed in an oxidizing ambience at a temperature greater than 100° C. for a duration between 10 seconds and 10 hours. In another example, structure 2400 is annealed in an oxidizing ambience at a temperature greater than or equal to 500° C. for a duration between 20 minutes and 1 hour. In another example, structure 2400 is annealed in a non-oxidizing ambience at a temperature between 100° C. and 700° C. for a duration between 10 seconds and 10 hours. Still in yet another example, structure 2400 is annealed in a non-oxidizing ambience at a temperature less than 500° C. for a duration between 20 seconds and 1 hour.

The thermal annealing not only forms the highly conductive S/D regions but also improve the channel quality by annihilating the native defects. In an aspect, the permeable gate stack (e.g., including the top gate 504 and a middle region/portion of the GI layer 506) facilitates improvement of the channel quality during the annealing process by minimizing a decrease in channel resistivity associated with the annealing, and in some cases increasing channel resistivity during the annealing process.

Figure 25:
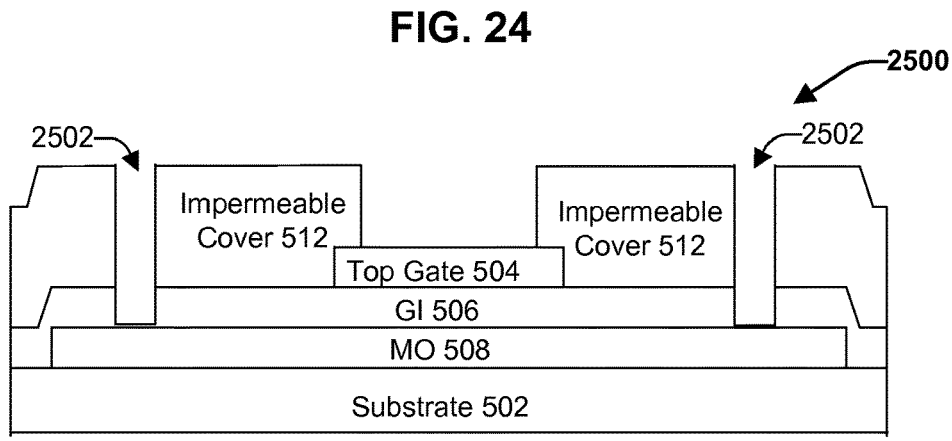
Figure 26:
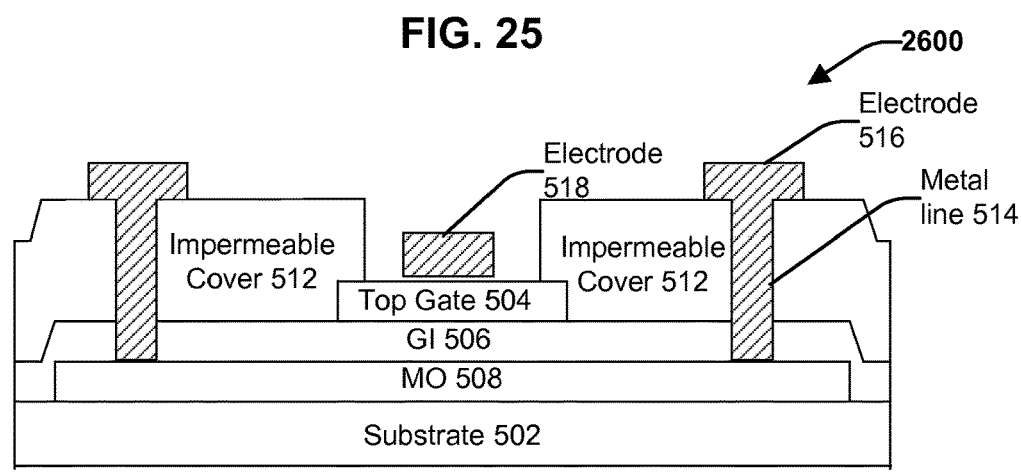

After annealing is complete, as shown in FIG. 25, contact holes/openings 2102 are formed through the impermeable covers 512 to the source and drain regions of the active MO layer 508 to establish intermediate structure 2500. Processing is then finalized to form the top gate MOTFT structure 2600 shown in FIG. 26 via deposition of electrodes 516, 518 and metal lines 514. In some aspects, although not depicted, a passivation layer can be deposited over structure 2400 prior to performing the processing steps associated with FIGS. 25 and 26. In an aspect, MOTFT structure 2600 corresponds to MOTFT device 500.

FIGS. 27-30 depict an example process for fabricating a top gate MOTFT device (e.g., MOTFT device 500) having self-aligned source and drain regions capped with gas impermeable covers in accordance with aspects and embodiments described herein. In particular, FIGS. 27-30 depict a process for forming a top gate MOTFT device with self-aligned S/D regions using a backside exposure technique. Repetitive description of like elements employed in respective embodiments of MOTFT devices and techniques for fabricating the MOTFT device described herein is omitted for sake of brevity.

In accordance with the backside exposure technique, the top gate MOTFT device is formed using a transparent substrate (e.g., glass) and a non-transparent gate stack. In addition, the top gate 504 should also be gas permeable and stay conductive during oxidizing and annealing. In order to accomplish all three requirements, the top gate 504 is formed with double layers, including an upper non-transparent sacrificial gate electrode 2704 (e.g., formed with Ti) and a lower functional top gate electrode 504 (e.g., formed with ITO). The upper non-transparent sacrificial gate electrode 2704 is used to assist backside exposure and removed later, while the bottom-gate electrode 504 serves as the actual functional gate electrode.

Figure 27:
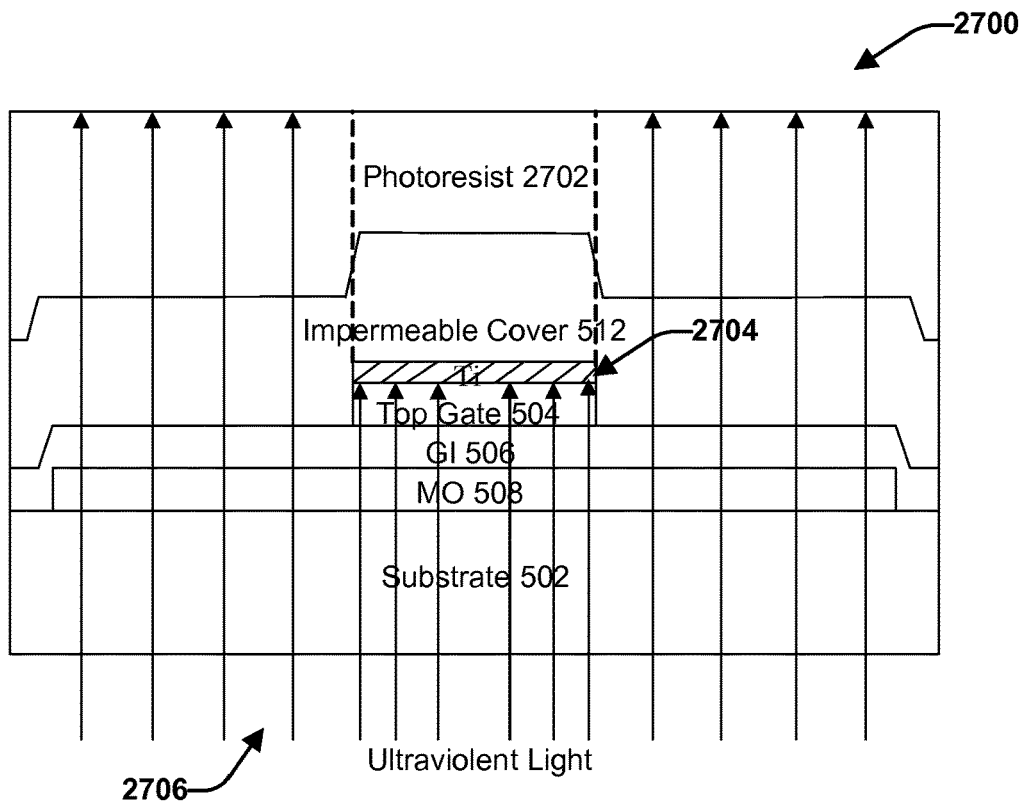
FIGS. 27-30 depict another example process for fabricating a top gate MOTFT device having source and drain regions capped with gas impermeable covers in accordance with aspects and embodiments described herein.
Figure 28:
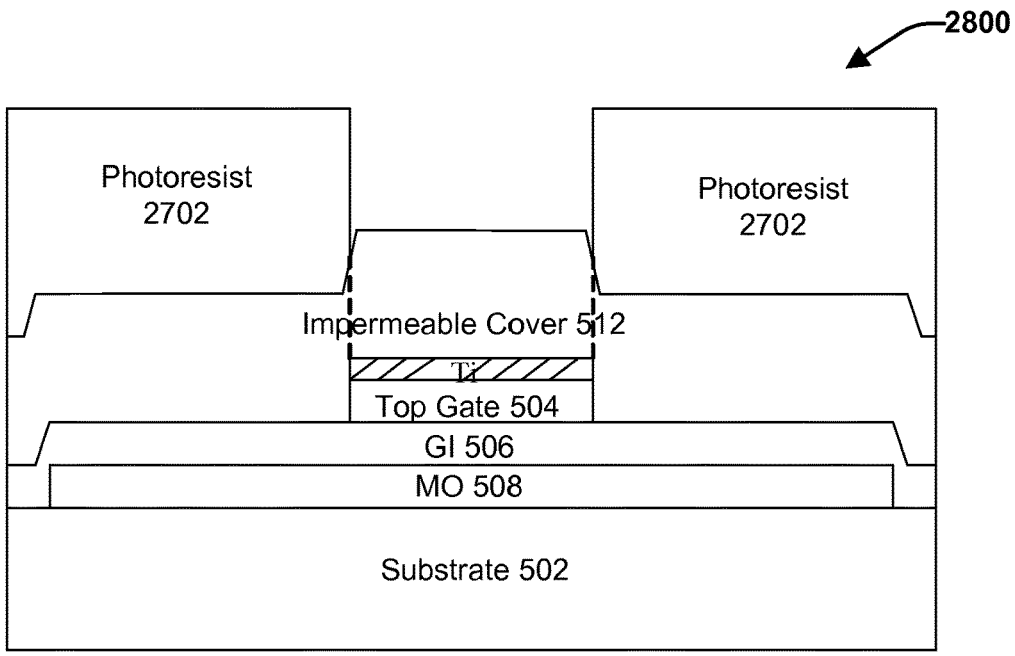

FIG. 27 depicts an intermediate transistor structure 2700 for forming a top gate MOTFT using the backside exposure technique. As see in FIG. 27, the active MO layer is formed over the substrate 502 (e.g., which is transparent), the GI layer 506 is formed over the active MO layer 508, the top gate 504 is formed over the GI layer 506 and the sacrificial gate electrode 2704 is formed over the top gate 504. The impermeable cover 512 is further formed over and adjacent to portion of the GI layer 506 and the sacrificial gate electrode 2702. A photoresist 2702 covers the impermeable cover 512. Structure 2700 is subjected to photolithography via shining of ultraviolent light toward the backside 2706 of the substrate 502 towards the photoresist 2702 (as indicated by the direction of the arrows). The portion of the photoresist 2702 above the gate stack (e.g. between the dashed lines) is protected from exposure by the backside ultraviolet light. When the photoresist is negative or an image reversal photoresist, exposed portions of the photoresist (e.g., outside of the dashed lines corresponding to the S/D regions) will remain after its development, as shown by structure 2800 of FIG. 28.

Figure 29:
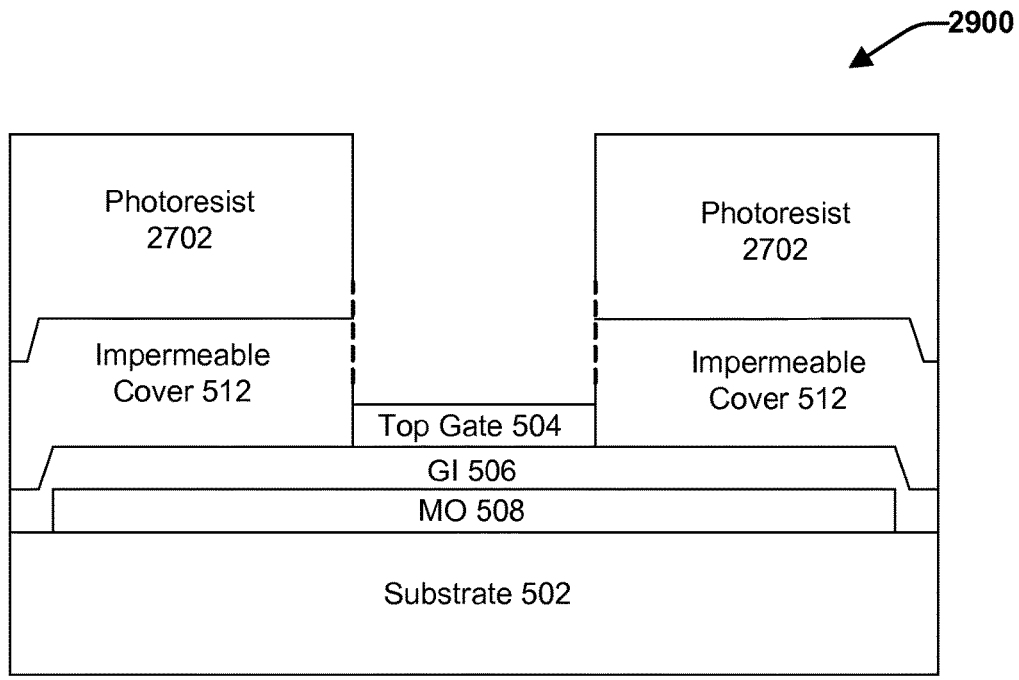

Referring to FIG. 29, after photolithography is performed, the portion of the impermeable cover 512 over the gate stack and the channel region is subsequently etched along with the sacrificial gate 2704 to form structure 2900 of FIG. 29. As seen in FIG. 29, the remaining portions of the impermeable cover 512 are self-aligned to the top gate 504, as indicated by the dashed lines of structure 2900. In an aspect, the etch selectivity between the functional and sacrificial gates need to be large enough. For example, when the functional gate 504 includes ITO and the sacrificial gate 2704 includes Ti, fluorine based plasma etching can remove Ti but not attack ITO. In another aspect, if the selectivity between the respective gates is not large enough, an etch-stop layer can be inserted between these two gates and then removed after photolithography development.

Figure 30:
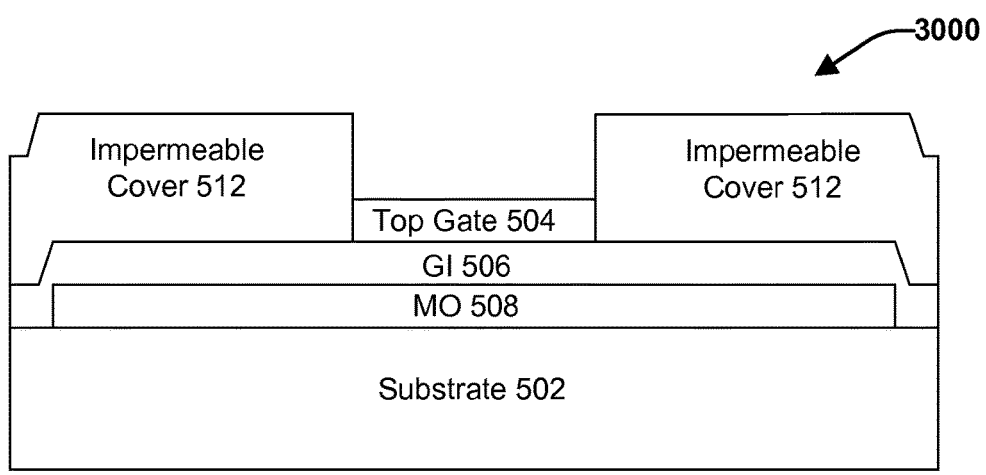

Thereafter, the remaining portions of the photoresist 2702 are removed, resulting in structure 3000 of FIG. 30. Thermal annealing is then performed on structure 3000 in accordance with aspects and embodiments described herein. After annealing is complete, although not shown, contact holes/openings are formed through the impermeable covers 512 to the source and drain regions of the active MO layer 508 (e.g., to establish intermediate structure 2500). Processing is then finalized (e.g., to form the top gate MOTFT structure 2600 shown in FIG. 26) via deposition of electrodes 516, 518 and metal lines 514.

FIGS. 31-34 depict another example process for fabricating a top gate MOFTF device (e.g., MOTFT device 500) having self-aligned source and drain regions capped with gas impermeable covers in accordance with aspects and embodiments described herein. In particular, FIGS. 31-34 depict a process for forming a top gate MOTFT device with self-aligned S/D regions using a lift off-process. Repetitive description of like elements employed in respective embodiments of MOTFT devices and techniques for fabricating the MOTFT device described herein is omitted for sake of brevity.

Figure 31:
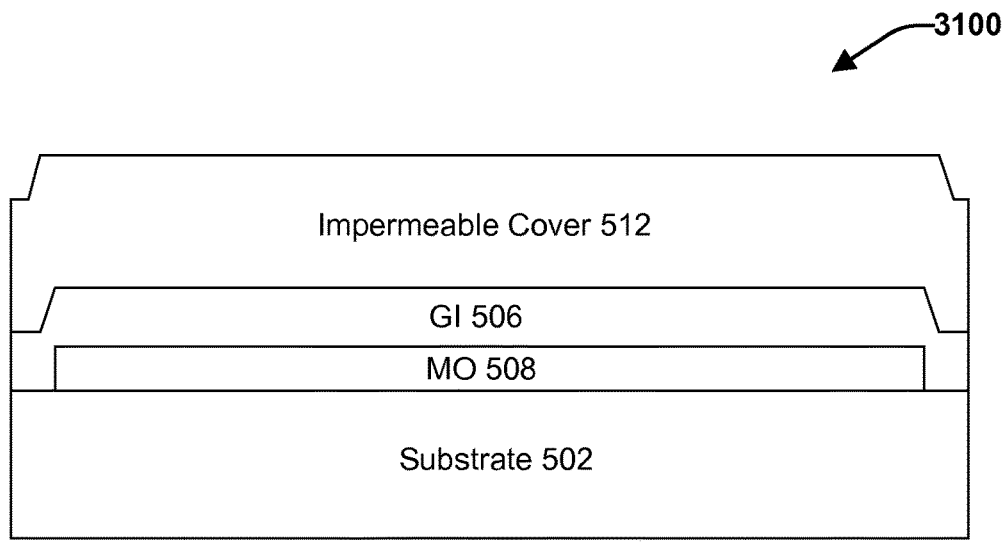
FIGS. 31-34 depict another example process for fabricating a top gate MOFTF device having source and drain regions capped with gas impermeable covers in accordance with aspects and embodiments described herein.
Figure 32:
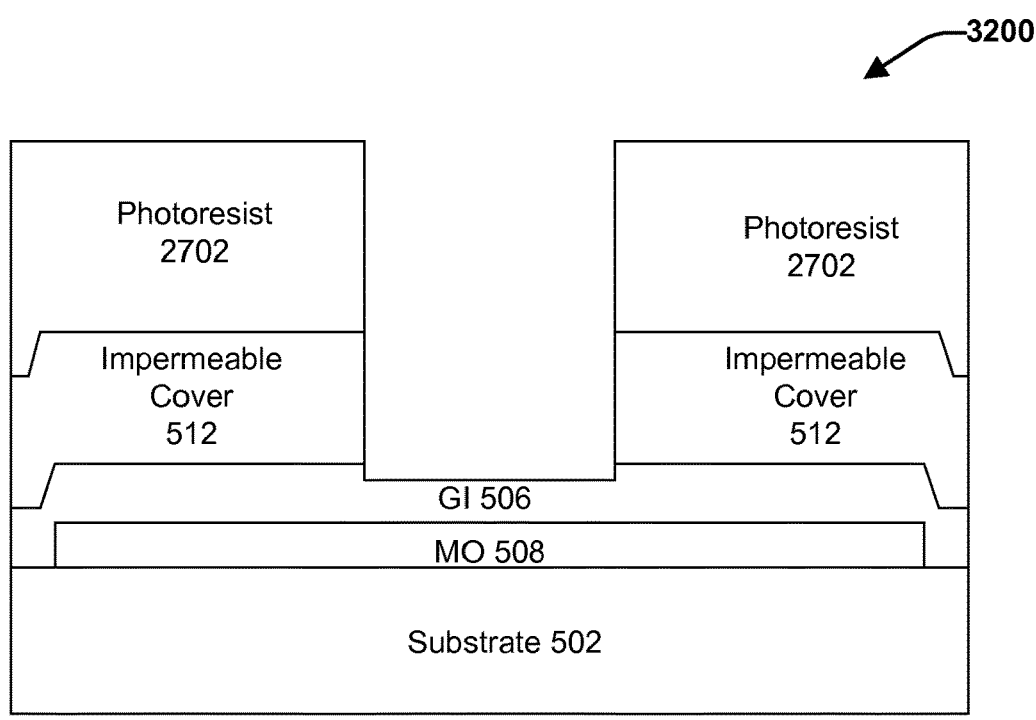
Figure 33:
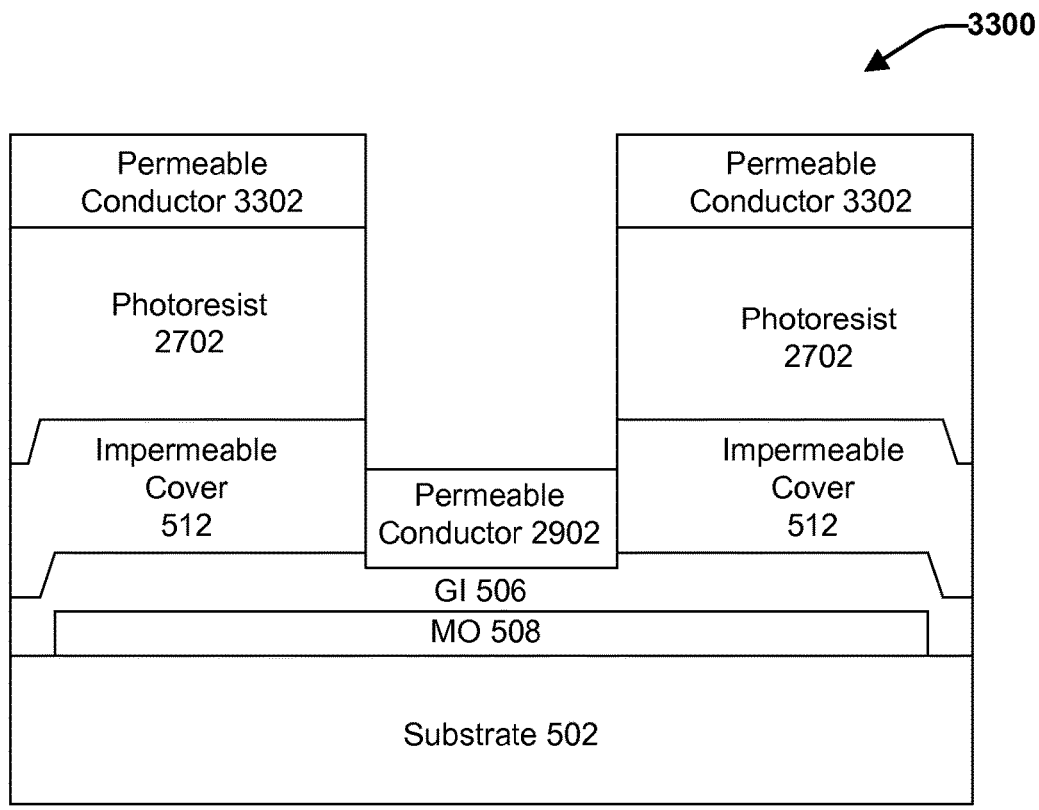
Figure 34:
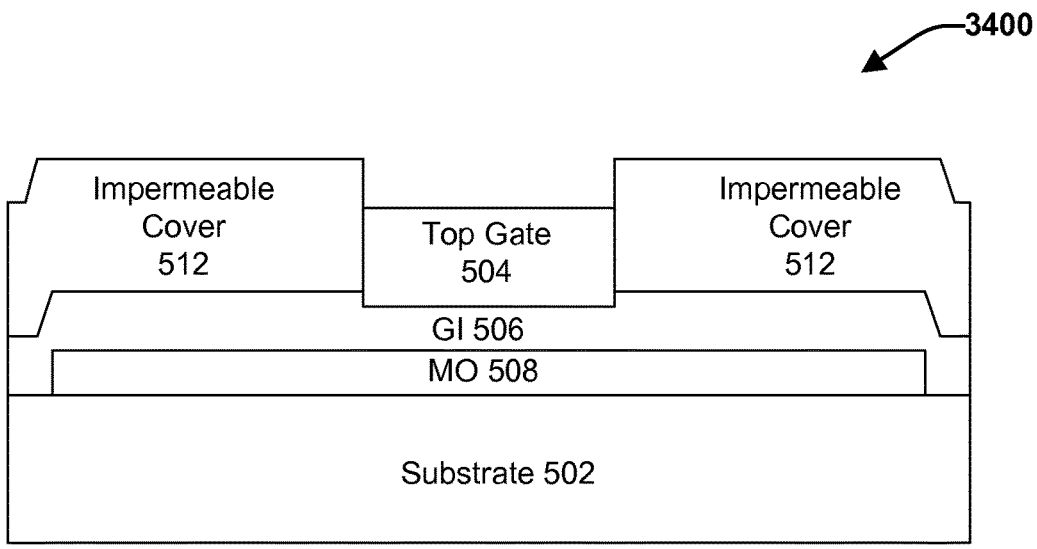

FIG. 31 depicts an intermediate transistor structure 3100 for forming a top gate MOTFT using a lift off technique. As see in FIG. 31, the active MO layer 508 is formed over the substrate 502, a gas permeable GI layer 506 is formed over the active MO layer 508, and an impermeable cover 512 is further formed over and adjacent the GI layer 506. The impermeable cover 512 is then patterned and etched using photolithography as shown in FIG. 32, resulting in structure 3200. As seen in FIG. 32, the impermeable cover 512 is patterned such that is covers the S/D regions of the active MO layer 508 but not the channel region. Then an oxygen-permeable conductor 3302 (such as ITO) is deposited over structure 3200. The resulting structure 3300 is depicted in FIG. 33. After deposition of the permeable conductor 3302, structure 3300 is patterned into the top-gate using a lift-off process. The resulting structure 3400 shown in FIG. 34 is then subjected to thermal annealing in accordance with aspects and embodiments described herein. After annealing is complete, although not shown, contact holes/openings are formed through the impermeable covers 512 to the source and drain regions of the active MO layer 508 (e.g., to establish intermediate structure 2500). Processing is then finalized (e.g., to form the top gate MOTFT structure 2600 shown in FIG. 26) via deposition of electrodes 516, 518 and metal lines 514.

FIGS. 35-39 illustrate methods in accordance with certain aspects of this disclosure. While, for purposes of simplicity of explanation, the methods are shown and described as a series of acts, it is to be understood and appreciated that this disclosure is not limited by the order of acts, as some acts may occur in different orders and/or concurrently with other acts from that shown and described herein. For example, those skilled in the art will understand and appreciate that methods can alternatively be represented as a series of interrelated states or events, such as in a state diagram. Moreover, not all illustrated acts may be required to implement methods in accordance with certain aspects of this disclosure.

Figure 35:
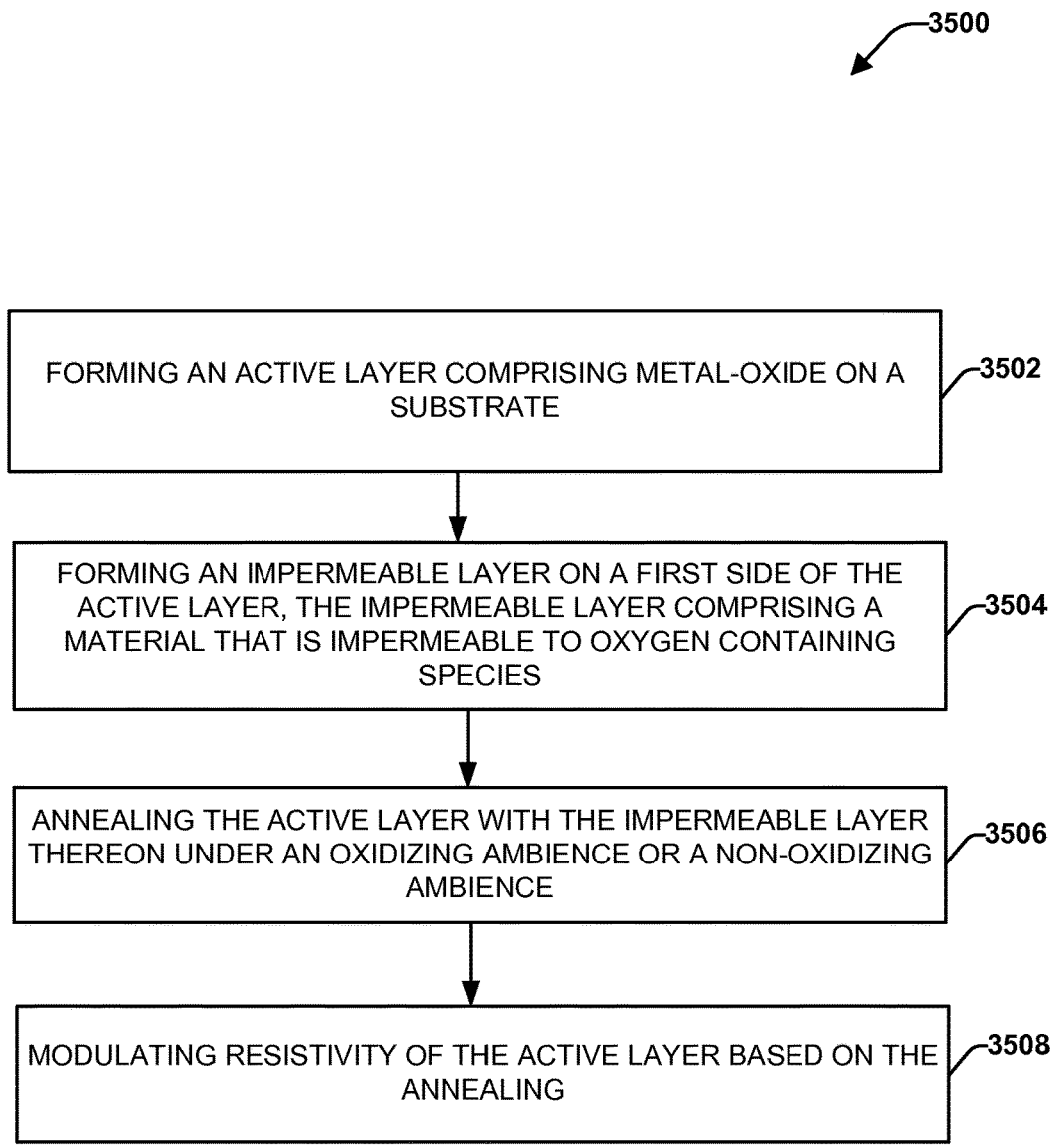
FIG. 35 provides a flow diagram of an example method for fabricating a MOTFT device having source and drain regions capped with gas impermeable covers in accordance with aspects and embodiments described herein.

Turning now to FIG. 35, presented is a high level flow diagram of an example process 3500 for fabricating a MOTFT with channel, source and drain regions respectively capped with covers of different gas permeability to control the resistivity of the respective regions using thermal annealing, in accordance with various aspects and embodiments of the subject disclosure. At 3502, an active layer comprising MO is formed on a substrate. At 3504, an impermeable layer is formed on a first side of the active layer, the impermeable layer including a material that is impermeable to oxygen containing species. In an aspect, the annealing is performed under oxidizing conditions at a temperature greater than or equal to 100° C. In another aspect, the annealing is performed under non-oxidizing conditions at a temperature between 100° C. and 800° C. At 3506, the active layer is annealed with the impermeable layer thereon, and at 3508, the resistivity of the active layer is reduced based on the annealing.

Figure 36:
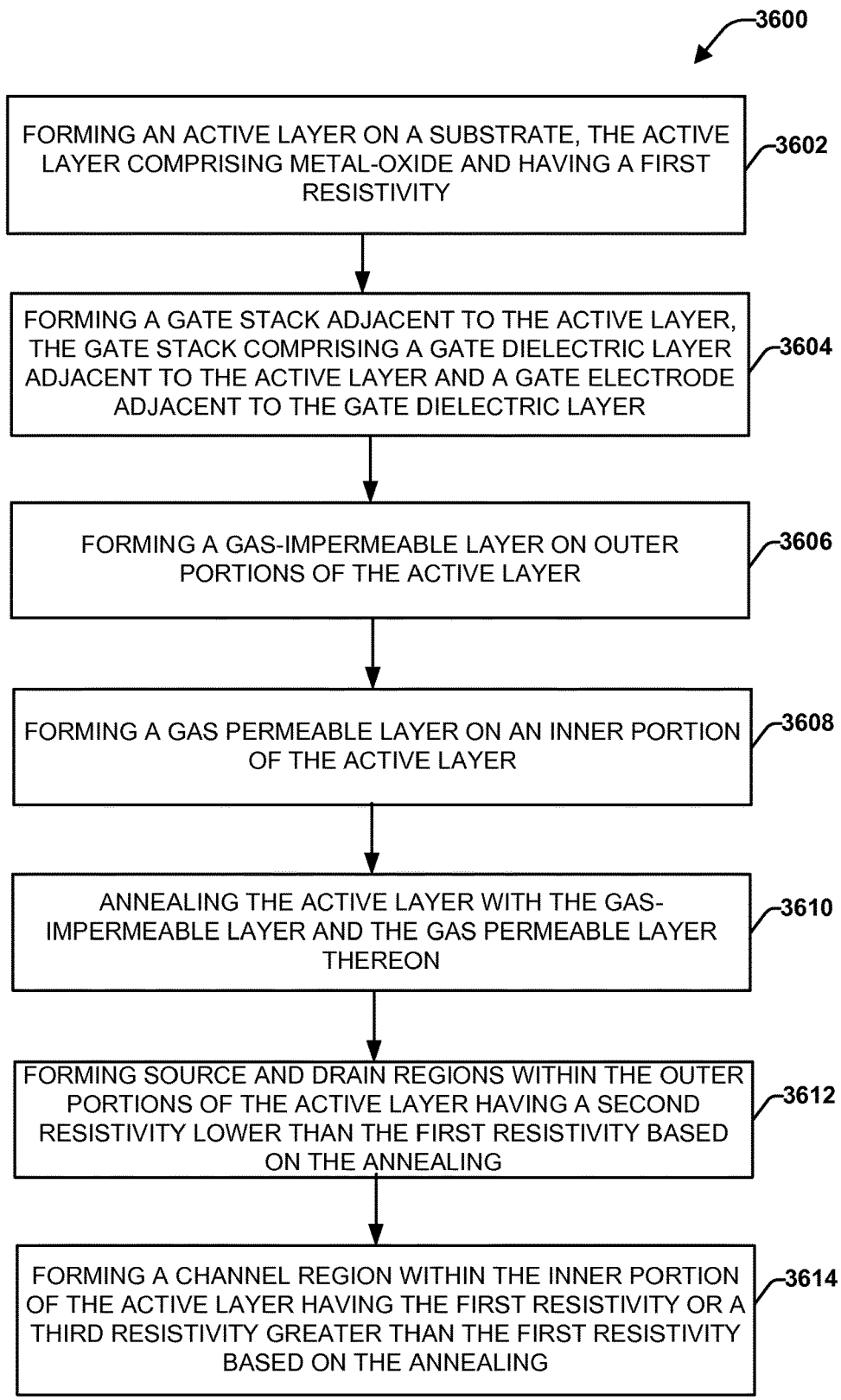
FIG. 36 provides a flow diagram of another example method for fabricating a MOTFT device having source and drain regions capped with gas impermeable covers in accordance with aspects and embodiments described herein.

FIG. 36 presents a flow diagram of another example process 3600 for fabricating a MOTFT with channel, source and drain regions respectively capped with covers of different gas permeability to control the resistivity of the respective regions using thermal annealing, in accordance with various aspects and embodiments of the subject disclosure. At 3602, an active layer is formed on a substrate, the active layer comprising MO and having a first resistivity. At 3604, a gate stack is formed adjacent to the active layer, the gate stack comprising a gate dielectric layer adjacent to the active layer and a gate electrode adjacent to the gate dielectric layer. At 3606, a gas-impermeable layer is formed on outer portions of the active layer. At 3608, a gas permeable layer is formed on an inner portion of the active layer. At 3610, the active layer is annealed with the gas-impermeable layer and the gas permeable layer thereon. At 3612, source and drain regions are formed within the outer portions of the active layer having a second resistivity lower than the first resistivity based on the annealing. At 3614, a channel region is formed within the inner portion of the active layer having the first resistivity or a third resistivity greater than the first resistivity based on the annealing.

Figure 37:
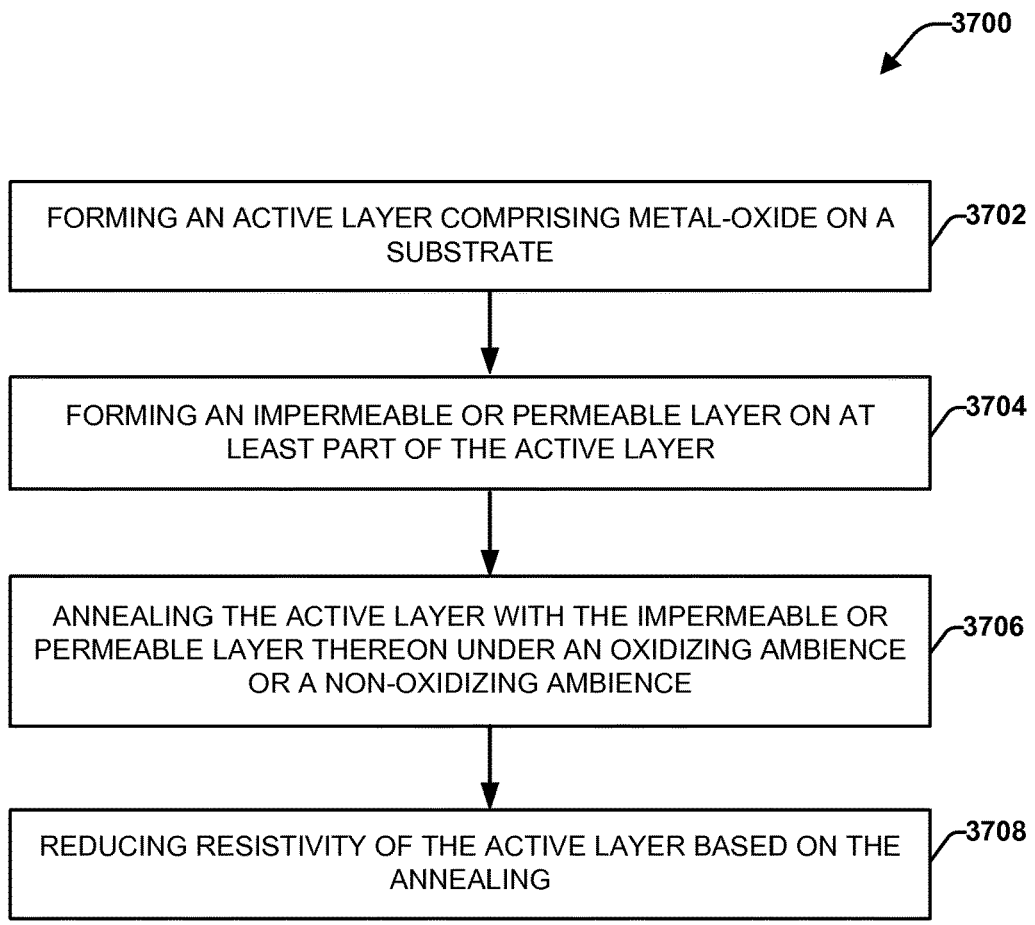
FIG. 37 provides a flow diagram of an example method for fabricating a junctionless MOTFT device in accordance with aspects and embodiments described herein.

FIG. 37 presents a flow diagram of an example process 3700 for fabricating a junctionless MOTFT in accordance with various aspects and embodiments of the subject disclosure. At 3702, an active layer including metal-oxide is formed on a substrate. At 3704, an impermeable or permeable layer is on at least part of the active layer. For example, the impermeable layer or the permeable layer can be formed only on outer portions of the active layer corresponding to S/D regions. In another example, the impermeable layer or the permeable layer is formed only on a middle portion of the active layer corresponding to a channel region. In another example, the impermeable layer or the permeable layer is formed over the entire active layer. At 3706, the active layer is annealed under an oxidizing ambience or a non-oxidizing ambience with the impermeable layer or the permeable layer formed thereon. In an aspect, the active layer is only annealed under a non-oxidizing ambience when the permeable layer is formed thereon. At 3708, the resistivity of the active layer is reduced based on the annealing.

Figure 38:
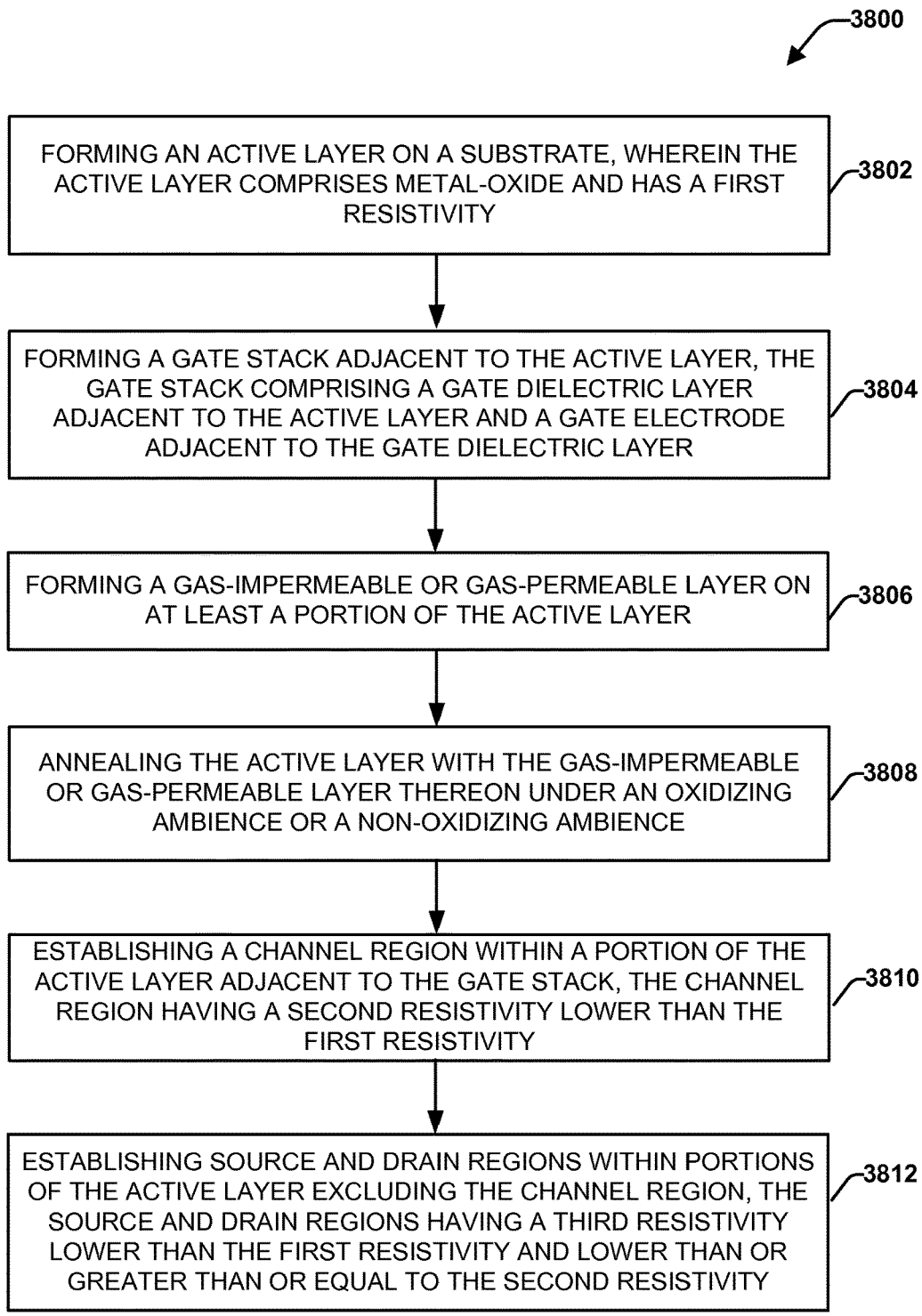
FIG. 38 provides a flow diagram of another example method for fabricating a junctionless MOTFT device in accordance with aspects and embodiments described herein.

FIG. 38 presents a flow diagram of another example process 3800 for fabricating a junctionless MOTFT in accordance with various aspects and embodiments of the subject disclosure. At 3802, an active layer on is formed on a substrate. The active layer includes metal-oxide and has a first resistivity. At 3804, a gate stack is formed on and adjacent to the active layer. The gate stack includes a gate dielectric layer adjacent to the active layer and a gate electrode adjacent to the gate dielectric layer. At 3806, a gas-impermeable or a gas-permeable layer is formed on at least a portion of the active layer. For example, the gas-impermeable layer or the gas-permeable layer can be formed only on outer portions of the active layer corresponding to S/D regions. In another example, the gas-impermeable layer or the gas-permeable layer is formed only on a middle portion of the active layer corresponding to a channel region. In another example, the gas-impermeable layer or the gas-permeable layer is formed over the entire active layer. At 3808, the active layer is annealed with the gas-permeable layer or the gas-impermeable layer formed thereon. At 3810, a channel region is established within a portion of the active layer adjacent to the gate stack, the channel region having a second resistivity lower than the first resistivity. At 1312, source and drain regions are established within portions of the active layer excluding the channel region, the source and drain regions having a third resistivity lower than the first resistivity and greater than or equal to the second resistivity.

Figure 39:
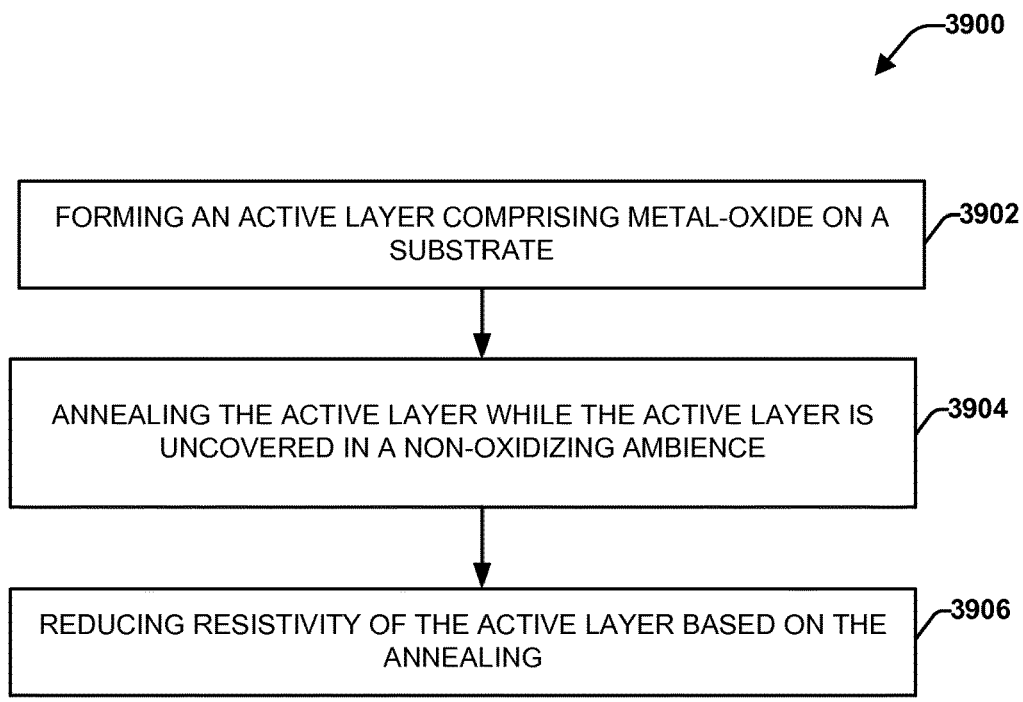
FIG. 39 provides a flow diagram of another example method for fabricating a junctionless MOTFT device in accordance with aspects and embodiments described herein.

FIG. 39 presents a flow diagram of an example process 3900 for fabricating a junctionless MOTFT in accordance with various aspects and embodiments of the subject disclosure. At 3902, an active layer including metal-oxide is formed on a substrate. At 3904, the active layer is annealed while uncovered in a non-oxidizing ambience. At 3906, the resistivity of the active layer is reduced based on the annealing.

What has been described above includes examples of the subject invention. It is, of course, not possible to describe every conceivable combination of components or methods for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

What is claimed is:

1. A transistor structure, comprising:
   an active layer comprising metal-oxide formed on a substrate, wherein the active layer comprises a channel region, a source region and a drain region, wherein the source region and the drain region are respectively provided on opposite sides of the channel region, and wherein the active layer comprises a top surface, a bottom surface and side surfaces;
   a gate electrode formed on a first portion of the active layer comprising the channel region,
   a gate dielectric layer formed between the gate electrode and the active layer;
   a gas-impermeable layer formed on the top surface of the active layer over an entirety of second portions of the active layer comprising the source region and the drain region, wherein the gas-impermeable layer is not formed on the first portion of the active layer and wherein the gas-impermeable layer is an insulator;
   a source electrode formed on the gas-impermeable layer and electrically connected to the source region; and
   a drain electrode formed on the gas-impermeable layer and electrically connected to the drain region.

2. The transistor structure of claim 1, wherein the substrate comprises at least one of, silicon, a transparent material, or a flexible material.

3. The transistor structure of claim 1, wherein the gate electrode is formed above the top surface of the active layer, and wherein the active layer is contacting the substrate.

4. The transistor structure of claim 1, wherein the active layer comprises at least one of: zinc oxide, zinc oxynitride, indium-zinc oxide, indium-gallium-zinc oxide, zinc-tin oxide, tin oxide, indium oxide, copper oxide, uranium oxide, bismuth oxide, barium titanate, strontium titanate, or lithium niobate.

5. The transistor structure of claim 1, wherein the active layer has a thickness between about 1 nm and about 1000 nm.

6. The transistor structure of claim 1, wherein the gas-impermeable layer comprises silicon nitride or aluminium oxide.

7. The transistor structure of claim 1, further comprising:
   a passivation layer formed over and contacting the gas-impermeable layer;
   contact holes formed within the passivation layer, the gas-impermeable layer, and the gate dielectric layer respectively reaching the source region, the drain region and the gate electrode; and
   metal lines formed within the contact holes.

8. The transistor structure of claim 1, wherein the source region and the drain region respectively have a doping concentration less than $1 \times 10^{15}$ cm$^{-3}$ and have a resistivity below $10^0$ Ω·cm.

9. An apparatus, comprising:
   a substrate;
   a source region and a drain region formed within an annealed active layer having resulted from an annealing of an active layer comprising metal-oxide and formed on the substrate wherein the annealed active layer comprises a top surface, a bottom surface, and side surfaces;
   a channel region provided within the annealed active layer between the source region and the drain region, wherein the source region and the drain region are respectively located on opposite sides of the channel region;
   a gate electrode formed on a first portion of the annealed active layer comprising the channel region,
   a gate dielectric layer formed between the gate electrode and the annealed active layer;
   an impermeable layer formed on the top surface of the annealed active layer over an entirety of second portions of the annealed active layer comprising the source region and the drain region and not formed on the first portion wherein the impermeable layer comprises an insulator material that is impermeable to oxygen containing species;
   a source electrode formed on the impermeable layer and electrically connected to the source region; and
   a drain electrode formed on the impermeable layer and electrically connected to the drain region,
   wherein the annealing resulting in the annealed active layer was performed with the impermeable layer over portions of the active layer corresponding to the source region and the drain region, thereby resulting in a reduction of resistivity of the source region and the drain region of the annealed active layer relative to the active layer.

10. The apparatus of claim 9, wherein the annealed active layer has a doping concentration less than $1 \times 10^{15}$ cm$^{-3}$, the source region and the drain region have a resistivity below $10^0$ Ω·cm, and the channel region has a resistivity above $10^0$ Ω·cm.

11. The apparatus of claim 9, wherein the annealed active layer is not doped.

12. The apparatus of claim 9, wherein the gate electrode is formed above the top surface of the active layer, and wherein the active layer is contacting the substrate, and wherein the apparatus further comprises:
a gate dielectric layer formed between the gate electrode and the first portion of the active layer, wherein the gate electrode and the gate dielectric layer are gas-permeable; and
wherein the annealing resulting in the annealed active layer was performed with the gate electrode and the gate dielectric layer formed over a portion of the active layer, thereby resulting in maintenance or increase of a resistivity of the channel region of the annealed active layer relative to the active layer.

13. The apparatus of claim 9, wherein the annealing resulting in the annealed active layer was performed under an oxidizing ambience at a temperature greater than or equal to 100° C.

14. The apparatus of claim 9, wherein the annealing resulting in the annealed active layer was performed under a non-oxidizing ambience at a temperature between 100° C. and 800° C.

15. The transistor structure of claim 1, wherein a doping concentration of the channel region is different than a doping concentration of the source region or the drain region.

16. The transistor structure of claim 1, wherein the source region and the drain region and the channel region respectively comprise a same doping concentration and the source region and the drain region respectively comprise a lower resistivity than the channel region.

17. The transistor structure of claim 1, wherein the active layer has a doping concentration less than $1 \times 10^{15}$ cm$^{-3}$, and the source region and the drain region respectively have a resistivity below $10^{-1}$ Ω·cm.

18. The apparatus of claim 9, wherein the gas-impermeable layer comprises silicon nitride or aluminium oxide.

19. The apparatus of claim 9, wherein the source region and the drain region and the channel region respectively comprise a same doping concentration and the source region and the drain region respectively comprise a lower resistivity than the channel region.

20. The apparatus of claim 9, wherein the annealed active layer has a doping concentration less than $1 \times 10^{15}$ cm$^{-3}$, and the source region and the drain region respectively have a resistivity below $10^0$ Ω·cm.

21. A transistor structure, comprising:
an active layer comprising metal-oxide formed on a substrate, wherein the active layer comprises a channel region, a source region and a drain region, wherein the source region and the drain region are respectively provided on opposite sides of the channel region, and wherein the active layer comprises a top surface, a bottom surface and side surfaces;
a gate electrode formed on a first portion of the active layer comprising the channel region;
a gate dielectric layer formed between the gate electrode and the active layer; and
a gas-impermeable layer formed on the top surface of the active layer over an entirety of second portions of the active layer comprising the source region and the drain region and not formed on the first portion of the active layer, wherein the gas-impermeable layer is an insulator.

22. The transistor structure of claim 21, further comprising:
a source electrode formed above the gas-impermeable layer and electrically connected to the source region; and
a drain electrode formed above the gas-impermeable layer and electrically connected to the drain region.

23. The transistor structure of claim 21, wherein the source and drain regions respectively have a resistivity below $10^0$ Ω·cm based on annealing of the annealed active layer with the gas-impermeable layer formed on and adjacent to the source region and the drain region.

24. The transistor structure of claim 1, wherein the channel region has a higher resistivity relative to the source region and the drain region.

25. The apparatus of claim 9, wherein the channel region has a higher resistivity relative to the source region and the drain region.

26. A transistor structure, comprising:
a substrate;
an active layer comprising metal-oxide formed on the substrate, wherein the active layer comprises a channel region, a source region and a drain region, and wherein the source region and the drain region are respectively provided on opposite sides of the channel region;
a gate insulating layer formed between the active layer and the substrate and contacting a bottom surface of the active layer;
a gate electrode formed between the gate insulating layer and the substrate and aligned with a first portion of the active layer comprising the channel region;
a gas-impermeable layer formed on portions of a top surface of the active layer and entirely covering second portions of the active layer comprising the source region and the drain region and not covering the first portion of the active layer, wherein the top surface opposes the bottom surface, and wherein the gas-impermeable layer is an insulator;
a source electrode formed on the gas-impermeable layer and electrically connected to the source region; and
a drain electrode formed on the gas-impermeable layer and electrically connected to the drain region.

27. The transistor structure of claim 26, wherein the gas-impermeable layer contacts the portions of the top surface of the active layer.

28. The transistor structure of claim 26, further comprising:
a gas-permeable layer formed on a portion of the top surface of the active layer covering the first portion and not covering the second portions.

29. The transistor structure of claim 26, wherein the substrate comprises at least one of, silicon, a transparent material, or a flexible material.

30. The transistor structure of claim 26, wherein the active layer comprises at least one of: zinc oxide, zinc oxynitride, indium-zinc oxide, indium-gallium-zinc oxide, zinc-tin oxide, tin oxide, indium oxide, copper oxide, uranium oxide, bismuth oxide, barium titanate, strontium titanate, or lithium niobate.

31. The transistor structure of claim 26, wherein the active layer has a thickness between about 1 nm and about 1000 nm.

32. The transistor structure of claim 26, wherein the gas-impermeable layer comprises silicon nitride or aluminium oxide.

33. The transistor structure of claim 28, wherein the gas-permeable layer comprises at least one of: silicon oxide and indium-tin oxide.

34. A transistor structure, comprising:
a substrate;
an active layer comprising metal-oxide formed on and contacting the substrate, wherein the active layer comprises a channel region, a source region and a drain region, and wherein the source region and the drain region are respectively provided on opposite sides of the channel region;
a gate insulating layer formed on and contacting the active layer;
a gate electrode formed on and contacting a first portion of a surface of the gate insulating layer that covers the channel region of the active layer;
a gas-impermeable layer formed on and contacting entire second portions of the surface of the gate insulating layer that respectively cover the source region and the drain region of the active layer, wherein the gas-impermeable layer is not formed on the first portion of the surface of the gate insulating layer, and wherein the gas-impermeable layer is an insulator;
a source electrode formed on the gas-impermeable layer and electrically connected to the source region; and
a drain electrode formed on the gas-impermeable layer and electrically connected to the drain region.

35. The transistor structure of claim 34, wherein the gate insulating layer is gas permeable.

36. The transistor structure of claim 34, wherein the substrate comprises at least one of, silicon, a transparent material, or a flexible material.

37. The transistor structure of claim 34, wherein the active layer comprises at least one of: zinc oxide, zinc oxynitride, indium-zinc oxide, indium-gallium-zinc oxide, zinc-tin oxide, tin oxide, indium oxide, copper oxide, uranium oxide, bismuth oxide, barium titanate, strontium titanate, or lithium niobate.

38. The transistor structure of claim 34, wherein the active layer has a thickness between about 1 nm and about 1000 nm.

39. The transistor structure of claim 34, wherein the gas-impermeable layer comprises silicon nitride or aluminium oxide.

40. The transistor structure of claim 1, wherein the gas-impermeable layer covers entire top surfaces of the source region and the drain region and does not cover any surface of the channel region.

41. The transistor structure of claim 7, wherein the gas-impermeable layer spans respective lengths of the source region and the drain region between the gate electrode and the metal lines.

42. The apparatus of claim 9, wherein the gas-impermeable layer covers entire top surfaces of the source region and the drain region and does not cover any surface of the channel region.

43. The transistor structure of claim 21, wherein the gas-impermeable layer covers entire top surfaces of the source region and the drain region and does not cover any surface of the channel region.

44. The transistor structure of claim 26, wherein the gas-impermeable layer covers entire top surfaces of the source region and the drain region and does not cover any surface of the channel region.

45. A transistor structure, comprising:
a gate electrode formed on a substrate;
an active layer comprising metal-oxide formed on and around the gate electrode such that the gate electrode is between the active layer and the substrate, wherein the active layer comprises a channel region that is aligned with the gate electrode, a source region and a drain region, wherein the source region and the drain region are respectively provided on opposite sides of the channel region and the gate electrode;
a gas-impermeable layer formed on and spanning respective lengths of the source region and the drain region and not formed on the channel region, wherein the gas-impermeable layer is an insulator;
a source electrode formed on the gas-impermeable layer and electrically connected to the source region; and
a drain electrode formed on the gas-impermeable layer and electrically connected to the drain region.

46. The transistor structure of claim 45, wherein the respective lengths of the source region and the drain region correspond to a first length between the gate electrode and the source electrode and a second length between the gate electrode and drain electrode.

47. The transistor structure of claim 45, further comprising a gate insulator layer formed between the gate electrode and the active layer.

48. The transistor structure of claim 45, further comprising, a gas-permeable layer formed on and spanning a length of the channel region between the source region and the drain region.

49. The transistor structure of claim 48, wherein the gas-permeable layer comprises at least one of: silicon oxide and indium-tin oxide.

50. The transistor structure of claim 48, wherein the gas-permeable layer has a thickness between about 10 nm and about 2000 nm.

51. The transistor structure of claim 45, wherein the source region and the drain region respectively have a doping concentration less than $1 \times 10^{15}$ cm$^{-3}$ and have a resistivity below $10^0$ Ω·cm.

* * * * *